(12) United States Patent
VanGilder et al.

(10) Patent No.: US 7,991,592 B2
(45) Date of Patent: *Aug. 2, 2011

(54) SYSTEM AND METHOD FOR EVALUATING EQUIPMENT RACK COOLING PERFORMANCE

(75) Inventors: James W. VanGilder, Pepperell, MA (US); Saurabh K. Shrivastava, Lowell, MA (US); Xuanhang Zhang, Tewksbury, MA (US)

(73) Assignee: American Power Conversion Corporation, West Kingston, RI (US)

(*) Notice: Subject to any disclaimer, the term of this patent is extended or adjusted under 35 U.S.C. 154(b) by 510 days.

This patent is subject to a terminal disclaimer.

(21) Appl. No.: 12/019,109

(22) Filed: Jan. 24, 2008

(65) Prior Publication Data

US 2008/0174954 A1 Jul. 24, 2008

Related U.S. Application Data

(60) Provisional application No. 60/897,076, filed on Jan. 24, 2007, provisional application No. 60/938,034, filed on May 15, 2007.

(51) Int. Cl.
| | |
|---|---|
| G06F 17/50 | (2006.01) |
| G01K 1/00 | (2006.01) |
| G01K 3/00 | (2006.01) |
| G01K 5/00 | (2006.01) |
| G01K 7/00 | (2006.01) |
| G01K 9/00 | (2006.01) |
| G01K 11/00 | (2006.01) |

(52) U.S. Cl. .............................. 703/1; 702/130; 361/688

(58) Field of Classification Search ...... 703/1; 702/130; 361/688

See application file for complete search history.

(56) References Cited

U.S. PATENT DOCUMENTS

| | | | |
|---|---|---|---|
| 5,581,478 | A | 12/1996 | Cruse et al. |
| 5,657,641 | A | 8/1997 | Cunningham et al. |
| 5,682,949 | A | 11/1997 | Ratcliffe et al. |
| 5,850,539 | A | 12/1998 | Cook et al. |
| 5,995,729 | A | 11/1999 | Hirosawa et al. |
| 6,134,511 | A | 10/2000 | Subbarao |
| 6,246,969 | B1 | 6/2001 | Sinclair et al. |
| 6,347,627 | B1 | 2/2002 | Frankie et al. |
| 6,374,627 | B1 | 4/2002 | Schumacher et al. |
| 6,574,104 | B2 | 6/2003 | Patel et al. |

(Continued)

FOREIGN PATENT DOCUMENTS

WO 2006/119248 A2 11/2006

OTHER PUBLICATIONS

Chandrakant D. Patel, Ratnesh Sharma, Cullen E. Bash, Abdlmonem Beitelmal, "Thermal Considerations in Cooling Large Scale High Compute Density Data Centers" IEEE 2002, pp. 767-776.*

(Continued)

Primary Examiner — Dwin M Craig
(74) Attorney, Agent, or Firm — Lando & Anastasi, LLP

(57) ABSTRACT

Aspects of the invention are directed to systems and methods for designing and analyzing data centers. One aspect is directed to a method of determining cooling characteristics of a data center. The method includes receiving data related to a configuration of equipment in the data center, identifying rack clusters in the configuration of equipment, and determining a capture index for at least one equipment rack of at least one rack cluster.

47 Claims, 14 Drawing Sheets

COLD-AISLE (RAISED-FLOOR) CLUSTER

U.S. PATENT DOCUMENTS

| | | |
|---|---|---|
| 6,672,955 B2 | 1/2004 | Charron |
| 6,694,759 B1 | 2/2004 | Bash et al. |
| 6,714,977 B1 | 3/2004 | Fowler et al. |
| 6,718,277 B2 | 4/2004 | Sharma |
| 6,721,672 B2 | 4/2004 | Spitaels et al. |
| 6,745,579 B2 | 6/2004 | Spinazzola et al. |
| 6,804,616 B2 | 10/2004 | Bodas |
| 6,819,563 B1 | 11/2004 | Chu et al. |
| 6,859,366 B2 | 2/2005 | Fink |
| 6,862,179 B2 | 3/2005 | Beitelmal et al. |
| 6,967,283 B2 | 11/2005 | Rasmussen et al. |
| 7,020,586 B2 | 3/2006 | Snevely |
| 7,031,870 B2 | 4/2006 | Sharma et al. |
| 7,051,946 B2 | 5/2006 | Bash et al. |
| 7,085,133 B2 | 8/2006 | Hall |
| 7,155,318 B2 | 12/2006 | Sharma et al. |
| 7,197,433 B2 | 3/2007 | Patel et al. |
| 7,251,547 B2 | 7/2007 | Bash et al. |
| 7,313,503 B2 | 12/2007 | Nakagawa et al. |
| 7,315,448 B1 | 1/2008 | Bash et al. |
| 7,426,453 B2 | 9/2008 | Patel et al. |
| 7,472,043 B1 | 12/2008 | Low et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 2001/0042616 A1 | 11/2001 | Baer |
| 2002/0059804 A1 | 5/2002 | Spinazzola et al. |
| 2003/0115024 A1 | 6/2003 | Snevely |
| 2003/0147216 A1 | 8/2003 | Patel et al. |
| 2003/0158718 A1 | 8/2003 | Nakagawa et al. |
| 2004/0020224 A1 | 2/2004 | Bash et al. |
| 2004/0065097 A1 | 4/2004 | Bash et al. |
| 2004/0065104 A1 | 4/2004 | Bash et al. |
| 2004/0075984 A1 | 4/2004 | Bash et al. |
| 2004/0089009 A1 | 5/2004 | Bash et al. |
| 2004/0089011 A1 | 5/2004 | Patel et al. |
| 2004/0240514 A1 | 12/2004 | Bash et al. |
| 2005/0023363 A1 | 2/2005 | Sharma et al. |
| 2005/0225936 A1 | 10/2005 | Day |
| 2005/0267639 A1 | 12/2005 | Sharma et al. |
| 2006/0080001 A1 | 4/2006 | Bash et al. |
| 2006/0112286 A1 | 5/2006 | Whalley et al. |
| 2006/0139877 A1 | 6/2006 | Germagian et al. |
| 2006/0214014 A1 | 9/2006 | Bash et al. |
| 2007/0038414 A1 | 2/2007 | Rasmussen et al. |
| 2007/0078635 A1 | 4/2007 | Rasmussen et al. |
| 2007/0174024 A1 | 7/2007 | Rasmussen et al. |
| 2009/0138888 A1 | 5/2009 | Shah et al. |

OTHER PUBLICATIONS

Ashra, "Thermal Guidelines for Data Processing Environments," 2004, Atlanta: American Society of Heating, Refrigerating, and Air-Conditioning Engineers, Inc.

Bash, C.E, Patel, C.D., and Sharma, R.K, "Efficient Thermal Management of Data Centers—Immediate and Long-Term Research Needs," Intl. J. Heat, Ventilating, Air-Conditioning and Refrigeration Research, 2003, vol. 9, No. 2, pp. 137-152.

Herrlin, M.K., "Rack Cooling Effectiveness in Data Centers and Telecom Central Offices: The Rack Cooling Index (RCI)," Ashrae Transactions, 2005, vol. 111(2), pp. 725-731.

Sharma, R.K., Bash, C.E., and Patel, C.D., "Dimensionless Parameters for Evaluation of Thermal Design and Performance of Large-Scale Data Centers," 8th ASME/AIAA Joint Thermophysics and Heat Transfer Conference, St. Louis, Missouri, Jun. 24-26, 2002.

Neil Rasmussen, "Cooling Strategies for Ultra-High Density Racks and Blade Servers", White Paper #46, pp. 1-22, American Power Conversion, Mar. 29, 2005, published on World Wide Web.

Neil Rasmussen, "Strategies for Deploying Blade Servers in Existing Data Centers", White Paper #125, pp. 1-14, American Power Conversion, Mar. 29, 2005, published on World Wide Web.

Kevin Dunlap, "Cooling Audit for Identifying Potential Cooling Problems in Data Centers", White Paper #40, pp. 1-18, American Power Conversion, May 20, 2004, published on World Wide Web.

Neil Rasmussen, "Calculating Total Cooling Requirements for Data Centers", White Paper #25, pp. 1-8, American Power Conversion, May 20, 2004, published on World Wide Web.

"Management Strategy for Network Critical Physical Infrastructure", White Paper #100, pp. 110, American Power Conversion, Dec. 15, 2003, published on World Wide Web.

Innovative Research, Inc., http://web.archive.org/web/20050405003224/http://www.inres.com/, Apr. 5, 2005, published on World Wide Web.

International Search Report for PCT/US06/16739 mailed Oct. 3, 2006.

APC User's Guide Brochure, "InfraStruXure Manager," Mar. 2004, 181 pps.

International Search Report for PCT/US2008/051908 mailed Jul. 3, 2008.

* cited by examiner

COLD-AISLE (RAISED-FLOOR) CLUSTER

HOT-AISLE (LOCAL-COOLER) CLUSTER

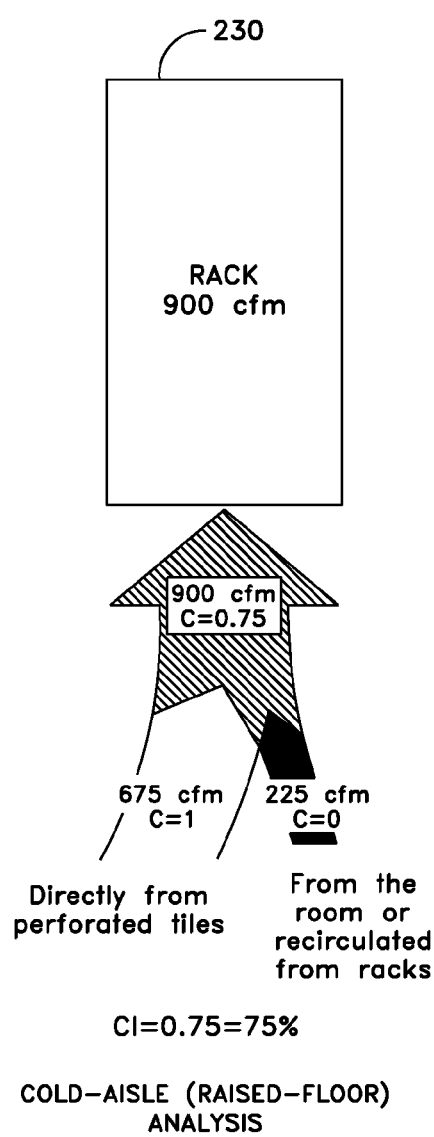
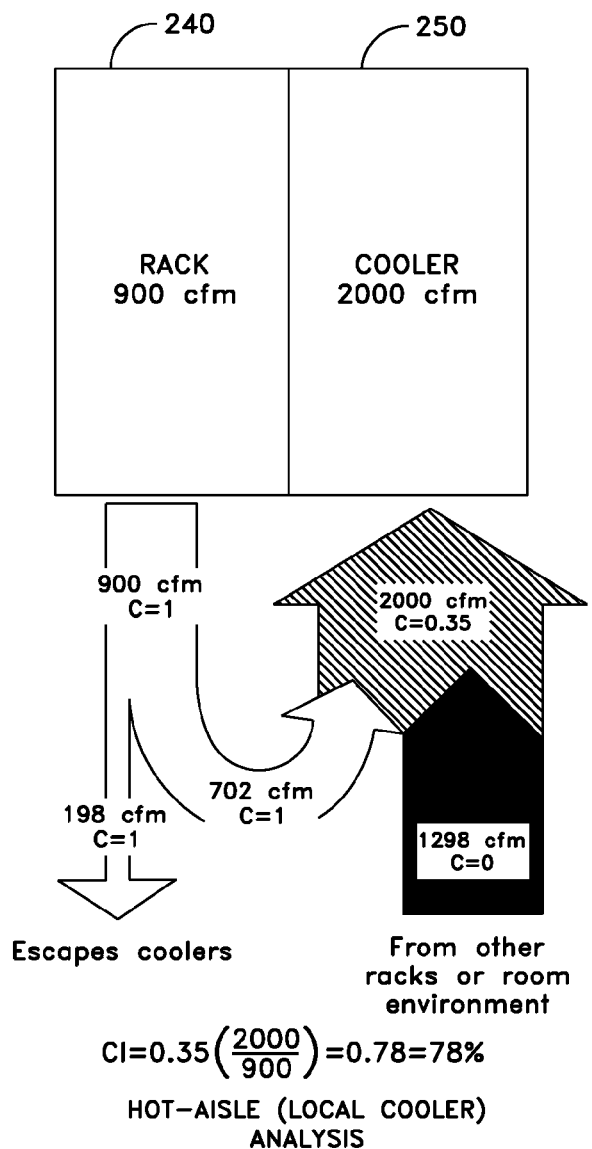
FIGURE 3a
FIGURE 3b

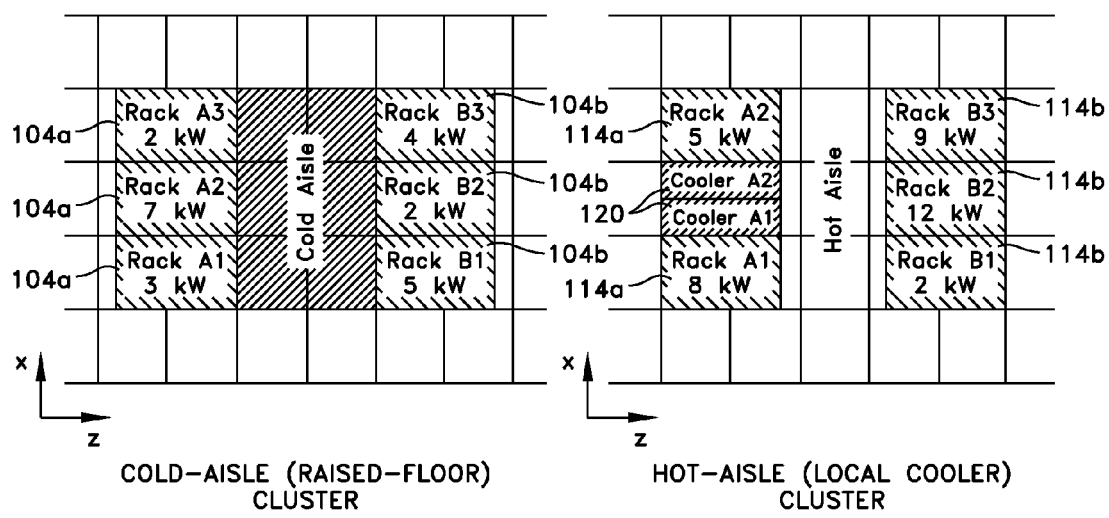
FIGURE 4a — COLD-AISLE (RAISED-FLOOR) CLUSTER
FIGURE 4b — HOT-AISLE (LOCAL COOLER) CLUSTER b) HOT-AISLE (LOCAL COOLER) ANALYSIS a) COLD-AISLE (LOCAL COOLER) ANALYSIS

|  | SHI | 0.005 |  | 0.067 | 0.298 | 0.286 |  |  | 0.176 |
|---|---|---|---|---|---|---|---|---|---|
| Max. Rack Inlet Temp. |  | 68 °F | C | 70 °F | 79 °F | 78 °F | C | C | 72 °F |
|  | CI | 100% |  | 100% | 93% | 100% |  |  | 90% |
|  |  | 3 kW |  | 6 kW | 10 kW | 6 kW |  |  | 6 kW |

Total Escaped Power=6.6 kW
Hot Aisle   Cluster SHI=0.18
$RCI_{HI}$ =98%

|  | CI | 4 kW | 4 kW | 5 kW | 10 kW | 8 kW | 12 kW |
|---|---|---|---|---|---|---|---|
| Max. Rack Inlet Temp. |  | 100% | 100% | 88% | 82% | 88% | 84% |
|  | SHI | 71 °F | 75 °F | 75 °F | 73 °F | 71 °F | 72 °F |
|  |  | 0.128 | 0.230 | 0.245 | 0.193 | 0.114 | 0.080 |

Initial Layout

FIGURE 6a

|  | SHI | 0.008 |  | 0.010 |  | 0.013 |  | 0.016 |  | 0.024 |
|---|---|---|---|---|---|---|---|---|---|---|
| Max. Rack Inlet Temp. |  | 68 °F | C | 68 °F | C | 68 °F | C | 68 °F | C | 69 °F |
|  | CI | 100% |  | 100% |  | 100% |  | 100% |  | 100% |
|  |  | 8 kW |  | 10 kW |  | 12 kW |  | 10 kW |  | 6 kW |

Total Escaped Power=0.51 kW
Hot Aisle   Cluster SHI=0.024
$RCI_{HI}$ =100%

|  | CI | 3 kW | 6 kW | 5 kW | 4 kW | 6 kW | 4 kW |
|---|---|---|---|---|---|---|---|
| Max. Rack Inlet Temp. |  | 100% | 96% | 99% | 98% | 99% | 98% |
|  | SHI | 69 °F | 69 °F | 69 °F | 69 °F | 69 °F | 69 °F |
|  |  | 0.015 | 0.028 | 0.051 | 0.051 | 0.045 | 0.032 |

Optimized Layout

FIGURE 6b

RAISED-FLOOR COLD-AISLE EXAMPLE

LOCAL-COOLER HOT-AISLE EXAMPLE

ROOM ENVIRONMENT

CAPTURE INDEX PREDICTIONS

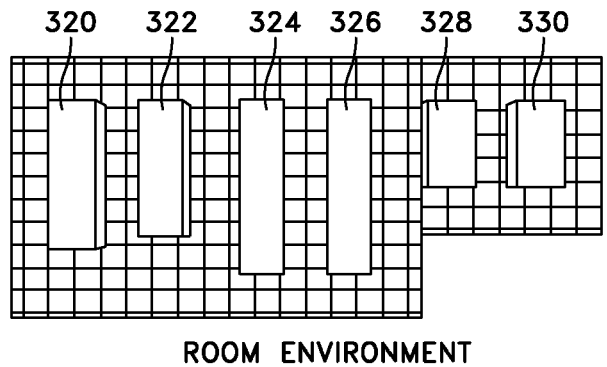
ROOM ENVIRONMENT
FIGURE 10a
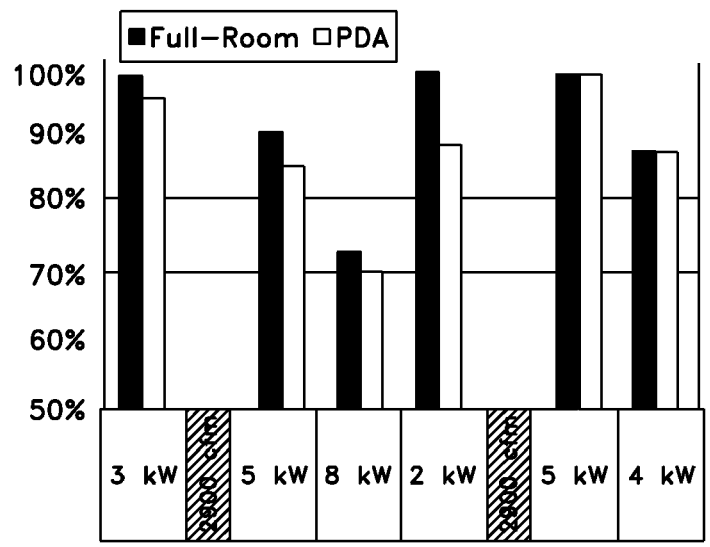
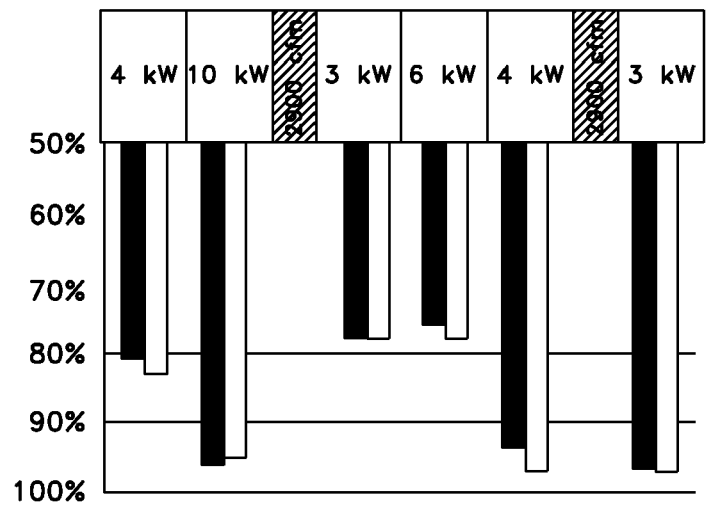
b) CAPTURE INDEX PREDICTIONS
FIGURE 10b

SYSTEM AND METHOD FOR EVALUATING EQUIPMENT RACK COOLING PERFORMANCE

RELATED APPLICATIONS

The present application claims priority under 35 U.S.C. §119(e) to U.S. Provisional Application Ser. No. 60/897,076, filed Jan. 24, 2007, entitled SYSTEM AND METHOD FOR EVALUATING EQUIPMENT RACK COOLING PERFORMANCE, and U.S. Provisional Application Ser. No. 60/938,034, filed May 15, 2007, entitled METHOD AND SYSTEM FOR MANAGING FACILITY POWER AND COOLING, both of which are hereby incorporated herein by reference.

BACKGROUND OF INVENTION

1. Field of Invention

At least one embodiment of the invention relates generally to methods and systems for analyzing and managing facility power and cooling.

2. Discussion of Related Art

Centralized data centers for computer, communications and other electronic equipment have been in use for a number of years, and more recently with the increasing use of the Internet, large scale data centers that provide hosting services for Internet Service Providers (ISPs), Application Service Providers (ASPs) and Internet content providers are becoming more prevalent. Typical centralized data centers contain numerous racks of equipment that require power, cooling and connections to external communications facilities. In modern data centers and network rooms, the increased density of computing equipment used in these facilities has put strains on the cooling and power systems of the facilities. In the past, typical power consumption for each equipment enclosure in a data facility was on the order of 1 kW. With the use of server blades and other high power density equipment in equipment racks, it is not uncommon for an equipment rack to have a power draw of 10 kW or even as high as 25 kW.

Typically, the power consumed by computer equipment is converted to heat and the cooling requirements of a facility are determined based on the power requirements of the facility. Typical data centers utilize air plenums under raised floors to distribute cooling air through a data center. One or more computer room air conditioners (CRACs) or computer room air handlers (CRAHs) are typically distributed along the periphery of the data room, and these units draw return air from the room or a ceiling plenum and distribute cooling air beneath the raised floor. Perforated tiles may be placed in front or beneath racks of equipment to be cooled to allow the cooling air from beneath the floor to cool equipment within the racks. More recently, in-row coolers have been used to draw warm air from a hot aisle in a data center and return cool air to a cool aisle in the data center.

With the increasing cooling and power requirements of computer equipment, it is necessary for a data center manager to determine if there is adequate power and cooling available in the facility when first designing a facility and before new or replacement equipment may be added. Typically, a data center manager may know, or can determine, if the total cooling capacity of the data center is sufficient for the total power draw. However, hot spots in a facility may develop, particularly where high power density equipment is used, and it may not be enough to merely analyze cooling capacity at the facility level. To attempt to identify hot spots, a data center manager may resort to manual temperature measurements throughout a facility and try to implement fixes to correct the hot spots. Such fixes may involve a rearrangement or replacement of perforated floor panels, a rearrangement of enclosures, and/or adding cooling capacity. In any case, these fixes are typically done on a trial and error basis, and while some hot spots may be eliminated, the fixes may cause other hot spots to arise due to a redirection of the cooling air in the facility. This trial and error approach can lead to unexpected failures of equipment, which is unacceptable in critical data centers. To avoid such failures, data center managers typically over design facilities and fail to use facilities to their full capacity.

SUMMARY OF THE INVENTION

The dimensionless capture index (CI) is a cooling performance metric used in at least one embodiment and is based on the airflow patterns associated with the supply of cool air to, or the removal of hot air from a rack. The capture index is typically a rack-by-rack metric with values between zero and 100%; higher values generally imply good cooling performance and scalability of a cooling architecture. In some embodiments, the capture index provides additional information relative to rack-inlet temperatures and other cooling indices. Two variants of capture index may be used in at least one embodiment, one for cold aisle analyses and another for hot aisle analyses.

One aspect of the invention is directed to a method of determining cooling characteristics of a data center. The method includes receiving data related to a configuration of equipment in the data center, identifying rack clusters in the configuration of equipment, and for each rack cluster determining whether the rack cluster is a hot aisle cluster or a cold aisle cluster, and determining a capture index for at least one equipment rack of at least one rack cluster based on identification of the at least one rack cluster as a hot aisle cluster or a cold aisle cluster.

In the method, receiving data may further include receiving information related to airflow and power associated with the equipment, including the airflow of cooling air available to the at least one rack cluster, and the temperature of the cooling air. Further, the information related to airflow may include airflow of rack hot air exhaust drawn by coolers, and may include the temperature of the rack hot air exhaust. The rack clusters may include at least one hot aisle cluster and may include at least one cold aisle cluster. The method may further include selecting a selected calculation model for determining the capture index based at least in part on the configuration of the equipment and calculating the capture index using the selected calculation model. The selected calculation model may be an algebraic model. In one version, the algebraic model calculates the capture index of a rack in a hot aisle cluster based on a ratio of total captured airflow to total supplied airflow at the rack, the total captured airflow is calculated based on airflow of all coolers in the hot aisle cluster and horizontal distances from the coolers to the rack, and the total supplied airflow is calculated based on airflow of the rack, airflow of neighboring racks and horizontal distances of the neighboring racks from the rack. The total supplied airflow and total captured airflow may be further calculated using a coupling coefficient to weight calculated airflow of racks in a row opposite the rack.

In another version of the method, the algebraic model calculates the capture index of a rack in a cold aisle cluster having a raised floor based on a ratio of total supplied airflow to total captured airflow at the rack, the total captured airflow is calculated based on airflow of the rack, airflow of neighboring racks and horizontal distances of the neighboring racks from the rack, and the total supplied airflow is calculated based on supplied airflow at the rack associated with airflow of tiles of the raised floor and geometric distances of the tiles from the rack. The total captured airflow may be calculated using a coupling coefficient to weight the calculated airflow of racks in a row opposite the rack.

In another version, the algebraic model calculates the capture index of a rack in a cold aisle cluster having both a raised floor and at least one cooler based on a ratio of total supplied airflow to total captured airflow at the rack, wherein the total captured airflow is calculated based on airflow of the rack, airflow of neighboring racks and horizontal distances of the neighboring racks from the rack, and wherein the total supplied airflow is calculated based on (1) supplied airflow at the rack associated with airflow of tiles of the raised floor and geometric distances of the tiles from the rack, and (2) airflow of coolers in the cold aisle cluster, airflow path of the coolers, and horizontal distances of the coolers from the rack.

In other versions of the method, the selected calculation model may be a computational fluid dynamics model, a neural network model, or a PDA-CFD model.

In the method, the data center may include at least one in-row cooling unit disposed in a row of equipment racks, and the method may further include determining temperature of return air to the at least one in-row cooling unit based on the capture index for each rack within a cluster associated with the in-row cooling unit. The method may further include determining total escaped power for at least one rack cluster, and providing an indication of the total escaped power. The method may also include comparing the capture index with a threshold and providing an indication if the capture index is below the threshold. The method may include optimizing a layout of at least one cluster based on an indication of a rack of the at least one cluster having a capture index less than the threshold and providing an optimized layout.

Another aspect is directed to a computer readable medium having stored thereon sequences of instructions including instructions that will cause a processor to receive data related to a configuration of equipment in the data center identify rack clusters in the configuration of equipment, and for each rack cluster determine whether the rack cluster is a hot aisle cluster or a cold aisle cluster and determine a capture index for at least one equipment rack of at least one rack cluster based on identification of the at least one rack cluster as a hot aisle cluster or a cold aisle cluster.

The computer readable medium may further include instructions that will cause the processor to receive information related to airflow and power associated with the equipment and may include instructions that will cause the processor to determine capture index based on airflow of cooling air available to the at least one rack cluster and based on temperature of the cooling air. The sequences of instructions may further include instructions that will cause the processor to determine capture index based on airflow of rack hot air exhaust drawn by coolers and to determine capture index based on temperature of the rack hot air exhaust. The sequences of instructions may further include instructions that will cause the processor to determine capture index for at least one rack of a hot aisle cluster having an in-row cooler. The sequences of instructions may include instructions that will cause the processor to determine capture index for at least one rack of one cold aisle cluster that receives cooling air from a perforated tile of a raised floor. The data center may include at least one in-row cooling unit disposed in a row of equipment racks, and the sequences of instructions may further include instructions that will cause the processor to determine temperature of return air to the at least one in-row cooling unit based on the capture index for each rack within a cluster associated with the in-row cooling unit. The sequences of instructions may include instructions that will cause the processor to determine total escaped power for at least one rack cluster, and provide an indication of the total escaped power. The sequences of instructions may include instructions that will cause the processor to compare the capture index with a threshold and provide an indication if the capture index is below the threshold. The sequences of instructions may include instructions that will cause the processor to optimize a layout of at least one cluster based on an indication of a rack of the at least one cluster having a capture index less than the threshold and provide an optimized layout.

Another aspect is directed to a data center management system. The data center management system includes a memory for storing data, and a controller coupled to the memory and configured to receive data related to a configuration of equipment in the data center, identify rack clusters in the configuration of equipment, and for each rack cluster determine whether the rack cluster is a hot aisle cluster or a cold aisle cluster, and determine a capture index for at least one equipment rack of at least one rack cluster based on identification of the at least one rack cluster as a hot aisle cluster or a cold aisle cluster.

In the system, the controller may be configured to receive information related to airflow and power associated with the equipment and may be configured to determine capture index based on airflow of cooling air available to the at least one rack cluster. The controller may be configured to determine capture index based on temperature of the cooling air, airflow of rack hot air exhaust drawn by coolers and temperature of the rack hot air exhaust. The controller may also be configured to determine capture index for at least one rack of a hot aisle cluster having an in-row cooler and configured to determine capture index for at least one rack of one cold aisle cluster that receives cooling air from a perforated tile of a raised floor. The controller may be further configured to determine temperature of return air to at least one in-row cooling unit based on the capture index for each rack within a cluster associated with the in-row cooling unit. The controller may be further configured to determine total escaped power for at least one rack cluster, and provide an indication of the total escaped power. The controller may be further configured to compare the capture index with a threshold and provide an indication if the capture index is below the threshold. The controller may be further configured to optimize a layout of at least one cluster based on an indication of a rack of the at least one cluster having a capture index less than the threshold and provide an optimized layout. The system may further include a graphical output device coupled to the controller, and the controller may be configured to provide a graphical output of a layout of at least one cluster of racks to the graphical output device.

BRIEF DESCRIPTION OF DRAWINGS

The accompanying drawings are not intended to be drawn to scale, in the drawings, each identical or nearly identical component that is illustrated in various figures is represented by a like numeral. For purposes of clarity, not every component may be labeled in every drawing. In the drawings:

FIG. 3a shows an example of calculation of capture index in accordance with one embodiment;

FIG. 3b shows an example of calculation of capture index in a second embodiment;

FIG. 4a shows an example of a cluster of racks surrounding a cold aisle used in accordance with a CFD calculation in one embodiment;

FIG. 4b shows an example of a cluster of racks surrounding a hot aisle used in accordance with a CFD calculation in one embodiment;

FIG. 6a shows a plan view of a cluster of racks used in the calculations of cooling performance in one embodiment;

FIG. 6b shows a plan view of the cluster of racks of FIG. 6b optimized for cooling performance;

FIG. 9b shows results of an analysis performed in accordance with one embodiment on a portion of the data center layout of FIG. 9a;

FIG. 10a shows a layout of a data center that may be analyzed in accordance with at least one embodiment;

FIG. 10b shows results of an analysis performed in accordance with one embodiment on a portion of the data center layout of FIG. 10a;

DETAILED DESCRIPTION

Figures 1A, 1B:
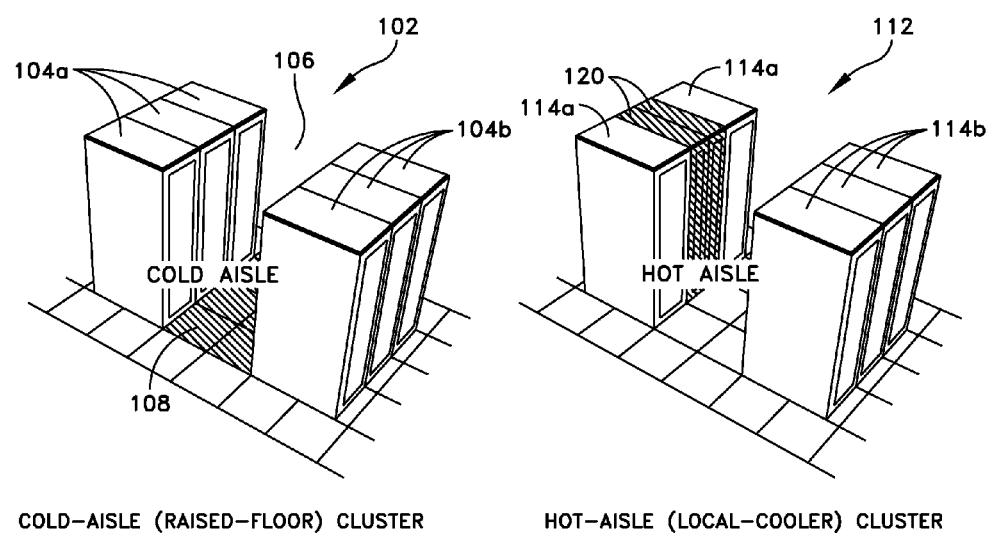
FIG. 1*a* shows a cluster of racks surrounding a cold aisle in a data center.
FIG. 1*b* shows a cluster of racks surrounding a hot aisle in a data center.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items. Within a data center, racks of electronics equipment are typically arranged in rows with cooling air supplied via a raised floor through perforated floor tiles. Warm air is typically returned to the room environment and ultimately to cooling units located around the perimeter of the room. Another option is to locate cooling units directly within or around the rows of racks to provide a close match between rack load and cooling resources, and because all required cooling is supplied locally, such a design is inherently scalable. With either architecture, equipment is often arranged in alternating cold and hot aisles to promote greater separation of the cold supply and warm return streams. While such an arrangement of equipment can be used to more efficiently provide cooling for data center equipment, the inability of a data center manager to accurately determine the cooling performance of a data center, can still lead to costly over design of the data center and potentially lead to failure of equipment due to overheating. U.S. patent application Ser. No. 11/342,300, titled Methods and Systems for Managing Facility Power and Cooling, filed Jan. 27, 2006, hereby incorporated herein by reference, discloses systems and methods for analyzing the cooling performance of a data center having rows of equipment racks. In the referenced application, airflow analysis is used to evaluate the cooling performance of a data center, using a number of different metrics including capture index (CI). Other metrics discussed herein include recirculation index (RI), Supply Heat Index (SHI), Return Heat Index (RHI) and Rack Cooling Index (RCI). The return heat index (RHI) and supply heat index (SHI) measure the degree of separation of cool supply and warm return streams on an enthalpy basis and are, therefore, based on temperatures. The rack cooling index (RCI) is a measure of the degree to which multiple racks in a data center are kept within some recommended inlet-temperature range. In the referenced application, capture index for a rack is defined as the percentage of air released by the rack into a hot aisle, which is captured by cooling units bounding the hot aisle. At least one embodiment discussed herein is directed to a system and/or method for analyzing and optimizing the cooling performance of a data center using the capture index metric for both hot aisles and cold aisles. The cold-aisle capture index for a rack is defined in one embodiment as the fraction of air ingested by the rack which originates from local cooling resources (e.g., perforated floor tiles or local coolers), while the hot-aisle capture index is defined in one embodiment as the fraction of air exhausted by a rack which is captured by local extracts (e.g., local coolers or return vents).

FIG. 1a shows a simple cold-aisle cluster 102 in a raised-floor environment. The cluster 102 includes equipment racks 104a arranged in a first row, and equipment racks 104b arranged in a second row with the front of the equipment racks 104a facing the front of the equipment racks 104b. A cold aisle 106 separates the first row from the second row, and the cold aisle includes perforated tiles 108 of a raised floor that provide cool air for equipment in the racks. The equipment racks 104a and 104b are configured to receive cool air for equipment into the fronts of the racks, and to exhaust warm air out of the backs of the racks. In at least one embodiment described herein, it is a design goal to ensure that all rack inlet temperatures are maintained within a specified range. The strategy used is to ensure that racks primarily ingest cooling airflow from the perforated tiles rather than warm re-circulated air which has already been heated by electronics equipment. The racks may have very different airflow requirements, and may compete with one another for cooling airflow supplied by all of the perforated tiles in the immediate neighborhood, which may include the entire cold aisle. Thus, it is the airflow dynamics within and around the cold aisle—along with supply and surrounding room temperatures that determines cooling performance, and a cold-aisle cluster is a particularly useful design and analysis unit used in particular embodiments.

FIG. 1b shows a simple hot-aisle cluster 112 in a hard-floor environment with local in-row coolers 120. The cluster 112 includes equipment racks 114a arranged in a first row, and equipment racks 114b arranged in a second row with the backs of the equipment racks 114a facing the backs of the equipment racks 114b. The equipment racks 114a and 114b are configured to receive cool air for equipment into the front of the racks, and to exhaust warm air into the hot aisle out of the backs of the racks. Each in-row cooler 120 in the figure is a half-rack-width cooling unit that draws warm air in from the hot aisle and provides cool air to the fronts of the racks 114a as well as racks 114b and other neighboring racks (not shown). In particular embodiments, when hot rack exhaust air is captured locally, as in FIG. 1b, a "room-neutral" design strategy may be employed wherein local coolers (or return vents) are configured to capture most of the hot rack exhaust airflow while supplying cooling air to a cool aisle at or near room temperature. If the room-neutral goal is achieved, many such clusters may be deployed throughout a data center with no or little net heating of the overall room environment and all equipment inlets will receive uniformly conditioned air. Hence, the cooling design is "scalable". In at least some embodiments that use a room-neutral design strategy the hot aisle is physically enclosed, thereby isolating it from the surrounding data center environment. Thus, it is the airflow dynamics within and around the hot aisle which determines the success of the room-neutral design strategy, and therefore, a hot-aisle cluster is a particularly useful design and analysis unit in at least some embodiments of the invention.

Since the capture index for each rack is defined in at least some embodiments with reference to local cooling resources (e.g. perforated tile airflow or cooler extract airflow in the immediate vicinity of the rack), discussion and examples herein focus on individual clusters. However, the use of capture index in embodiments is not restricted to the types of clusters shown in FIGS. 1a and 1b; a cold aisle cluster could be, for example, defined as a single row of racks served by a number of perforated tiles which need not even be immediately adjacent to the racks.

As discussed above, the cold-aisle capture index for a rack is defined in at least some embodiments as the fraction of air ingested by the rack which originates from local cooling resources (e.g., perforated floor tiles or local coolers). The hot-aisle capture index is defined as the fraction of air exhausted by a rack which is captured by local extracts (e.g., local coolers or return vents). CI therefore varies between 0 and 100% with better cooling performance generally indicated by greater CI values. In a cold-aisle analysis, high CI's ensure that the bulk of the air ingested by a rack comes from local cooling resources rather than being drawn from the room environment or from air which may have already been heated by electronics equipment. In this case, rack inlet temperatures will closely track the perforated-tile airflow temperatures and, assuming these temperatures are within the desired range, acceptable cooling will be achieved. In a hot-aisle analysis, high CI's ensure that rack exhaust is captured locally and there is little heating of the surrounding room environment.

While good (high) CI values typically imply good cooling performance; low CI values do not necessarily imply unacceptable cooling performance. For example, in a rack in a raised-floor environment which draws most of its airflow from the surrounding room environment rather than from the perforated tiles, the rack's cold-aisle CI will be low; however, if the surrounding room environment is sufficiently cool, the rack's inlet temperature may still be acceptable. In this case, the rack's cooling needs are met by the external room environment rather than perforated tiles within the rack's cluster. If this process is repeated many times across the data center, facility cooling will be complex and may be unpredictable. High CI values lead to inherently scalable cluster layouts and more predictable room environments.

In embodiments above, CI has been defined as a rack-level quantity relative to local cooling resources. In other embodiments, the definition of CI could be extended to any grouping of inlets and outlets, for example, a single server with reference to a single perforated tile. In this case, the metric would indicate the fraction of airflow ingested by the server which originated from the single perforated tile.

The capture index in at least some embodiments quantifies "from where the rack inlet airflow originated" (cold-aisle CI) or "to where the exhaust airflow ultimately traveled" (hot-aisle CI). In at least some embodiments, CI's are computed for each rack relative to local cooling resources and therefore, quantify the breakdown between cooling supplied locally and the cooling drawn from the surrounding room environment. For example (FIG. 3A) a rack in a cold-aisle raised-floor cluster with a CI of 65% receives 65% of its cooling airflow from its own cold aisle and the remaining 35% from the room environment. Thus, CI is a rack-by-rack measure of the room-independence and scalability of a cooling solution.

In at least one embodiment, the capture index metric is used within a data center management application to evaluate the cooling performance of a data center and to optimize the cooling performance. The evaluation and optimization may be done as part of an initial design of a data center, as part of a retrofit of a data center, or periodically in an existing data center. In addition, in at least some embodiments, the return temperature of in-row coolers may be determined as part of the analysis and used to optimize the cooling performance of a data center and ensure that coolers are operated efficiently. The data center management application may be co-located with other applications on a server in the data center, may be operated on a dedicated server, and/or may be incorporated in an existing data center management solution, such as the InfraStruXure Central and InfraStruXure Manager available from American Power Conversion Corporation of West Kingston, R.I.

Figure 2:
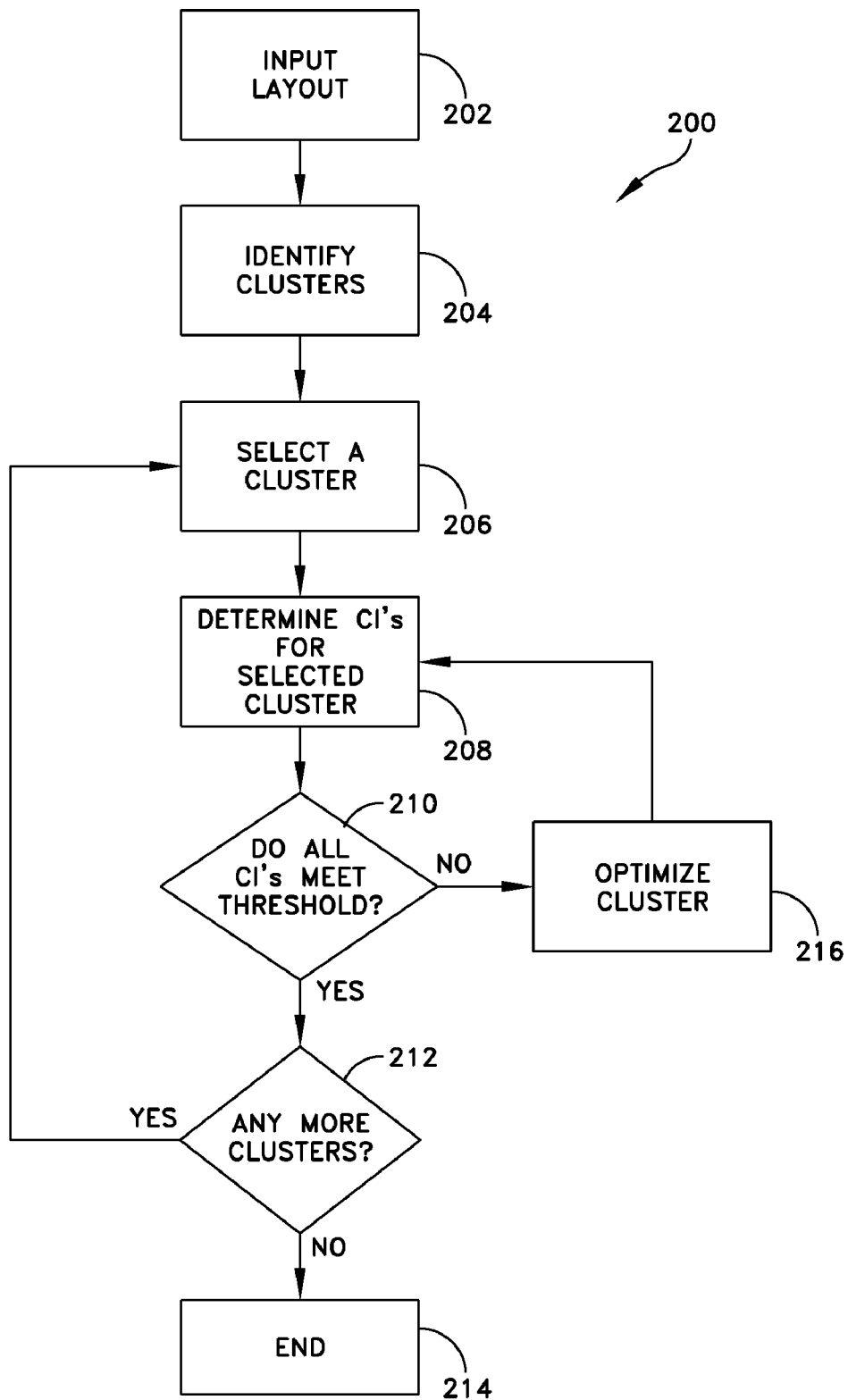
FIG. 2 shows a flow chart of a process of one embodiment.

A process 200 for designing and analyzing a data center using the data center management application in accordance with at least one embodiment will now be described with reference to FIG. 2 which shows a flow chart of the process 200. In a first stage 202 of the process, an initial layout of the data center is determined. The layout may be for a new data center, for an existing data center, or for a data center to be upgraded. In one embodiment, the layout may be provided to the application using for example, existing CAD information, while in other embodiments, the layout may be determined automatically by the application as further described in U.S. patent application Ser. No. 11/342,300, referenced above.

In a next stage 204 of the process, clusters of racks are identified in the layout where clusters typically consist of two parallel rows of equipment which are approximately equal in length and separated from one another by a cold or hot aisle. Hot aisle clusters, cold aisle clusters and mixed mode clusters are identified. Cold aisle clusters are typically used in the analysis for clusters that use raised floor cooling, and hot aisle clusters are typically used in the analysis for clusters that utilize in-row coolers. In addition to hot aisle clusters and cold aisle clusters, a particular cluster of racks may be identified as a mixed mode cluster when both in-row coolers and perforated tile cooling is used. For mixed mode clusters, in at least one embodiment, a cold aisle CI analysis is used. In one embodiment, racks may be contained in more than one cluster, and the CI for the racks may be run for such racks for each cluster. When multiple CI values are determined for a rack, the higher CI is selected in the analysis as the CI for the rack, however, in other embodiments, the lower CI may be used, both may be used, or an average or some other mathematical combination of the CI values may be used.

In the next stage 206 of the process a cluster is selected and at stage 208 a capture index analysis is run for a selected cluster and a capture index is determined for each rack in the cluster. Details on performing the analysis are provided further below. As discussed below, in embodiments of the invention, a number of different computational methods may be used to determine capture index.

In stage 210 of the process, the CI for each rack of the cluster is compared to a threshold value which may depend on the temperature difference between the maximum target rack inlet temperature and the supply airflow temperature which includes cooling airflow supplied by perforated tiles and coolers. As the difference between the target and supply temperatures is reduced, the CI threshold for "good" cooling performance increases. In one embodiment, the data center management application will provide the CI results for the cluster on a display screen. On the screen, the calculated values for the CI can be displayed along with a color code, such as green, yellow and red, to indicate that the CI for the rack is satisfactory (green), unsatisfactory (red) or marginal (yellow). If each of the racks in a cluster has a satisfactory result, then the process determines at stage 212 whether there are more clusters to be analyzed. If the outcome of stage 212 is YES, the process returns to stage 206 where a next cluster is selected and analyzed. If the outcome of stage 212 is NO, then the process ends at stage 214. If the outcome of stage 210 is NO, then the process proceeds to an optimization stage 216 where the cluster layout is optimized to improve performance. After optimization, the process returns to stage 206, for determination of CI's for the optimized layout.

During the optimization process, positions of racks and coolers in the cluster, types of coolers used, location of perforation panels, and other variables may be optimized until the CI for each rack in the cluster is greater than the threshold. In at least one embodiment, the optimization process may be automated and performed by the data center management application, while in other embodiments, a user may be required to modify the data center design to optimize the cooling performance. Still in other embodiments, the optimization process may include a combination of automatic optimization and user input. Details on the optimization process are provided further below.

Using the process 200 described above, the capture index metric can be used to produce a data center layout having a satisfactory cooling performance. Particular examples and further details on the use of CI in embodiments of the invention will now be described in further detail. As discussed above, the CI metric can be used to optimize the placement of racks and coolers in a hot-aisle cluster with local coolers like that shown in FIG. 1b. The design goal for the cluster in at least one embodiment is to ensure that all rack exhaust is captured by the coolers so that there is no net heating of the room. In this case, rack-by-rack CI values explicitly show how much of each rack's airflow is captured so that appropriate design changes may be implemented until an acceptable (or optimal) solution is found. In this case, rack inlet temperatures and temperature-based indices only indicate the symptoms of the incomplete capture of hot rack exhaust while CI values identify the racks which cause the elevated rack inlet temperatures. With the problem racks identified, finding a design solution is typically a fairly straightforward process. For example, electronics equipment or computer loads can be moved, coolers may be added, or the exhaust of individual racks or entire hot aisles may be physically contained. An example is provided below which illustrates the use of CI values to optimize the layout of a hot-aisle cluster in a local cooler environment.

With a raised-floor environment, a room-neutral design strategy typically cannot be employed because hot rack exhaust air is returned to the cooling units "through the room." In this case, the CI analysis focus is on the airflow and temperatures within and around the cold aisle rather than hot aisle, and rack inlet temperatures explicitly identify the problem racks so that appropriate design changes may be implemented until an acceptable (or optimal) solution is found. For example, electronics equipment or computer loads may be moved, perforated tile types and locations may be changed, or additional cooling units may be added. With a raised-floor environment (or other environment in which a cold-aisle is the design focus), there are two primary reasons why CI values are useful in addition to or in lieu of rack inlet temperatures. First, as discussed above, CI values indicate from where cooling resources are supplied and thus measure the room-independence and scalability of a design. Although there may be multiple ways to arrange a fixed set of equipment which all yield acceptable, or even ideal, rack inlet temperatures, the best layout may be the one that has least impact on the room environment. The overall effect of a cluster on the room environment can be determined from the total escaped power, a cluster-wide metric based on CI which is discussed below. Secondly, in some applications, airflow patterns can be predicted with some degree of accuracy even when the temperature cannot.

In at least one embodiment, the CI for each rack is computed based on computational fluid dynamics (CFD) or similar simulations. To compute CI, the origin of the airflow which is ingested by racks in a cold-aisle or by coolers in a hot-aisle analysis is quantitatively determined. This can be achieved by strategically introducing one or more passive concentration species into a numerical model where the concentration of species i at any point in the fluid is defined as $$C^i = \frac{\text{mass of species } i}{\text{total mass of fluid}} \qquad (1)$$

where "fluid" here refers to the air and all concentration species. Each concentration species is assigned physical properties identical to the data center air; its purpose is solely to act as a passive tracer. Typically the concentration species at the cooling-air supply or rack exhausts are prescribed the value "1" in the numerical model—in other words the cooling or rack exhaust flow is made to consist entirely of the passive tracer concentration. As the concentration species travel within and around the cold or hot aisle, they mix with other fluids; the amount of dilution of the concentration species computed at the rack or cooler inlets can then be used to compute capture index.

The technique outlined above is implemented through CFD analysis where species conservation equations may be solved simultaneously along with other conservation equations governing the airflow. Alternatively, since the passive concentration species do not affect airflow patterns, the concentration distributions may be determined separately from known airflows; for example, as a post-processing step.

The CI for each rack in a cold-aisle cluster is computed as the fraction of the rack's airflow which comes directly from perforated floor tiles or coolers located within the cluster. Therefore, only one concentration species, ($C^1$ or simply, C) need be defined and it is used to identify the air emerging from all perforated tiles or local coolers. All cooling airflow entering the cluster is generally assigned the concentration $C_{cooling}$ and the capture index at each rack i can be computed as $$CI_i = \frac{C_i}{C_{cooling}} \quad (2)$$

where $C_i$ is the concentration at the inlet of rack i. Since the value of $C_{cooling}$ is arbitrary, it is convenient to set $C_{cooling}=1$ in the numerical analysis making the capture index numerically equal to the computed inlet concentration at each rack:

$$CI_i = C_i \quad (3)$$

Note that not all local sources of cooling airflow need be assigned a value of $C_{cooling}$. If, for example, the airflow from only one perforated tile is "tagged" with $C_{cooling}$, the computed capture index will indicate how much of the rack's airflow originated from that one perforated tile.

FIG. 3a shows a simple example of computing the cold-aisle capture index for a rack 230 in a raised-floor environment. A concentration of C=1 is prescribed to the perforated tile airflow. A portion of the rack's airflow comes directly from the perforated tiles and the remainder consists of air drawn from the room environment or rack exhausts. The two streams mix and the numerical analysis shows that the concentration at the rack inlet is C=0.75 and the capture index is 75% based on Equation 3. Consistent with the definition of the cold-aisle capture index, FIG. 3a shows that 75% of the rack's airflow came directly from the perforated tiles: CI=675/900=0.75.

The CI for each rack in a hot-aisle cluster can be computed as the fraction of the rack's airflow which is captured by all coolers within the rack's cluster. To track the airflow from each rack, one concentration species $C^i$ is used to individually identify the exhaust air from each rack. (An alternative approach would be to use a single species concentration and, instead, compute CI for only one rack at a time performing the computation as many times as needed to cover all racks in the cluster.) The fraction of air exhausted from rack i which is captured by cooler (or local extract) j is $$f_{ij} = \frac{C_j^i Q_j}{C_i^i Q_i} \quad (4)$$

where $C_i^i$ is the concentration of species i prescribed at the exhaust or rack i $C_j^i$ is the concentration of species i computed at the inlet of cooler j $Q_i$ is the volumetric airflow rate through rack $Q_j$ is the volumetric airflow rate through cooler j For convenience, the concentration and rack indices correspond. For example, concentration species 1 is assigned to the exhaust of rack 1, concentration species 2 is assigned to the exhaust of rack 2, etc. The $f_{ij}$ of Equation 4 may be useful on its own in embodiments of the invention as it quantifies exactly how much airflow from each rack is captured by each specific cooler in the local cluster. The capture index is the sum of the fractions of air exhausted from rack i which is captured by cooler j summed over all N local coolers:

$$CI_i = \sum_{j=1}^{N} \frac{C_j^i Q_j}{C_i^i Q_i} \quad (5)$$

Since the numerical value of $C_i^i$ is arbitrary, it is convenient to set $C_i^i=1$ in the numerical analysis, making the capture index:

$$CI_i = \sum_{j=1}^{N} \frac{C_j^i Q_j}{Q_i} \quad (6)$$

Unlike the cold-aisle capture index, the hot aisle capture index calculation depends on the rack (and cooler) airflow rates. The difference arises because while both variants of CI are defined with respect to rack airflow rates, the computed values of interest in cold-aisle analyses are rack-inlet concentrations while those in hot-aisle analyses are cooler-inlet concentrations.

In the above discussion, the capture index is computed with reference to local coolers. The same procedure could be followed to determine how much airflow from each rack ultimately travels to any extract such as a traditional cooling unit located near the perimeter of the room or local coolers in a neighboring cluster of racks.

FIG. 3b shows a simple example of computing the hot-aisle capture index for a rack 240 in a local-cooler environment having an in-row cooler 250. A concentration of C=1 (a superscript for identifying the concentration species is unnecessary since there is only one rack and thus one concentration species of interest in the example) is prescribed at the rack exhaust. A portion of the rack exhaust is captured by the cooler 250 while the remainder escapes into the room environment. The cooler draws airflow from the rack of interest and from other racks or from the room environment. The numerical analysis shows that the concentration at the cooler 250 extract is C=0.35 and, as shown in FIG. 3b, CI=0.78 as computed based on Equation 6. Consistent with the definition of the hot-aisle capture index, FIG. 3b shows that 78% of the rack's airflow is captured by the cooler: CI=702/900=0.78. Since CI is always a number between 0 and 1, Equation 6 limits the physically-possible cooler inlet concentrations associated with each rack in the cluster.

The clusters of FIGS. 1a and 1b will now be analyzed by CFD analysis in order to demonstrate the computation and physical interpretation of the cold aisle and hot aisle capture indices. CFD software programs are available from a number of sources, and in one embodiment, CFD analyses are performed using Flovent Software v 6.1, available from Flomerics, Group PLC, Surrey, UK. A small sealed room environment is assumed in both cases with the exception that airflow is exhausted uniformly through the ceiling in the cold-aisle example. Alternatively, the entire surrounding data center, including the raised-floor plenum, in the cold-aisle example could be simulated. The airflow patterns in and around the cold and hot aisles and thus the computed CI's would be somewhat different; however, the calculation technique and physical interpretation of the CI's would be the same.

FIGS. 4a and 4b show the power values and identification labels assigned to each of the racks 104a, 104b, 114a, 114b. For simplicity in this analysis, rack airflow is taken based on an assumed 20° F. temperature rise across each rack. Racks are modeled as simple "black boxes" with front-to-back airflow. The perforated floor tiles in the cold-aisle example deliver a uniform 350 cfm per tile; the half-rack-width coolers in the hot-aisle example are modeled as black boxes with front-to-back airflow of 2900 cfm each in the opposite direction relative to rack airflow. In different embodiments, these assumptions can be changed to accommodate specific room, rack and equipment parameters.

In the cold-aisle example, FIG. 4(a), C=1 is assigned to the airflow emerging from the perforated floor tiles. The rack inlet concentrations computed in the CFD simulation are numerically equal to the desired CI values. Results are summarized in Table 1.

TABLE 1

Cold-Aisle Example Summary

| Rack | Power (kW) | Airflow (cfm) | C at Rack Inlet | CI |
|------|------------|---------------|-----------------|-----|
| A1 | 3 | 480 | 0.49 | 49% |
| A2 | 7 | 1120 | 0.84 | 84% |
| A3 | 2 | 320 | 0.67 | 67% |
| B1 | 5 | 800 | 0.26 | 26% |
| B2 | 2 | 320 | 0.67 | 67% |
| B3 | 4 | 640 | 0.28 | 28% |

With a very low CI value, rack B1, receives little airflow directly from the perforated tiles. Conversely, rack A2, with a much larger CI value, receives most of its airflow directly from the perforated floor tiles. It is clear from the low CI values (and FIG. 4a) that the cooling performance is likely unacceptable and the cluster layout does not represent a scalable solution.

In the hot-aisle example of FIG. 4b, 5 concentration species are used with one assigned to each rack in the cluster. Concentration $C_1^1=1$ is assigned to rack A1's exhaust, $C_2^2=1$ is assigned to rack A2's exhaust, etc. up through rack B3 which is assigned $C_5^5=1$. The cooler inlet concentrations are obtained using CFD simulation and CI values are calculated according to Equation 6. For example, the CI associated with rack B1 is computed as follows with reference to Table 2:

TABLE 2

Hot-Aisle Example Summary $$CI = \left(\frac{2900}{320}\right)(0.089 + 0.012) = 0.91 \quad (7)$$

| | | | C at Cooler Extract | | |
|------|------------|---------------|----------|----------|-----|
| Rack | Power (kW) | Airflow (cfm) | Cooler A1 | Cooler A2 | CI |
| A1 | 8 | 1280 | 0.426 | 0.010 | 99% |
| A2 | 5 | 800 | 0.008 | 0.215 | 81% |
| B1 | 2 | 320 | 0.089 | 0.012 | 91% |
| B2 | 12 | 1920 | 0.244 | 0.405 | 98% |
| B3 | 9 | 1440 | 0.031 | 0.299 | 66% |

With a CI value of 66%, 34% of the airflow from rack B3 is not captured by the coolers and escapes the hot aisle. Further, most of the airflow exiting rack A1 is captured by the coolers (97% by cooler A1 and 2% by cooler A2 as computed per Equation 6). While the cooling performance of the hot-aisle cluster may be better than that of the cold-aisle cluster, the low CI values indicate that cooling performance may still be unacceptable and the cluster is probably not a scalable solution.

As discussed above, the rack-level capture index measures the fraction of the rack's cooling resources that are supplied locally. However, to compare the overall performance and scalability of an entire cluster relative to another, a cluster-wide metric may be used in embodiments of the invention. In at least one embodiment of the invention, at the completion of process 200, a management application determines total escaped power from a cluster of racks, and can optimize the layout of the cluster to further reduce the total escaped power for the cluster while maintaining a favorable capture index for each rack of the cluster.

Figures 5A, 5B:
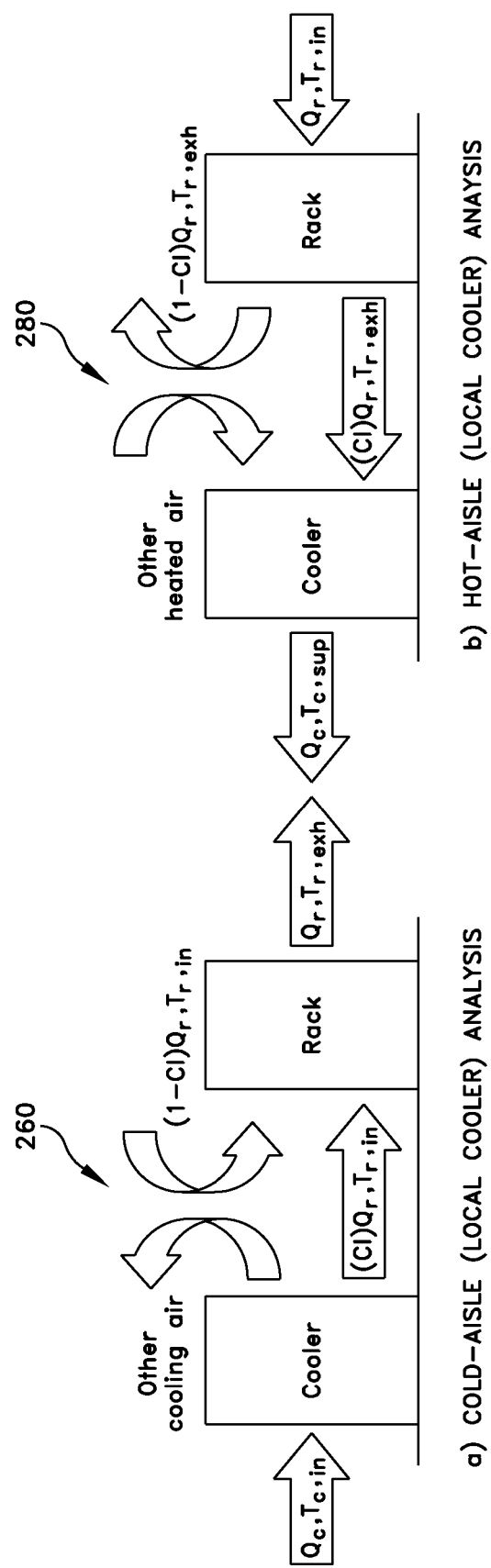
FIGS. 5a and 5b demonstrate the calculations of cluster wide performance metrics in accordance with one embodiment.

Total escaped power will be discussed further with reference to a simple local-cooler cold aisle cluster 260 and a simple hot aisle cluster 280 shown in FIGS. 5a and 5b. In the cold-aisle analysis "other cooling air" represents un-captured cooling airflow that is lost to the room environment while "other heated" air in the hot-aisle analysis represents warm air from other racks and the room environment. Indicated temperatures are assumed to be average values taken over the entire rack inlet and exhaust and cooler extract and supply. For either analysis, the rack airflow can be separated into two parts: the product of CI and $Q_r$, is the "desirable" portion of rack airflow; the remainder, $(1-CI)Q_r$, is the "undesirable" portion.

In the case of the hot-aisle analysis, the goal is to minimize the heating of the external data center environment. With reference to FIG. 5b, this escaped power is equivalent to the enthalpy rise of the portion of the rack exhaust airflow which leaves the cluster:

$$P_{escaped} = (1-CI)\rho Q_r c_p (T_{r,exh} - T_{r,in}) = (1-CI)P \quad (8)$$

where

ρ is the density of air
$Q_r$ is the rack volumetric airflow rate
$c_p$ is the specific heat of air at constant pressure
$T_{r,exh}$ is the rack exhaust temperature
$T_{r,in}$ is the rack inlet temperature
P is the total rack power The total power which escapes the cluster is the sum of Equation 8 over all n racks $$P_{total\ escaped} = \sum_{i=1}^{n}(1-CI_i)P_i \quad (9)$$

In the case of the cold-aisle cluster it is desirable to minimize the amount of cooling supplied by the room environment external to the cluster. With reference to FIG. 5a, this cooling power is equivalent to the enthalpy rise of the portion of rack airflow drawn from the external room environment which may be computed as $$P_{external\ cooling} = (1-CI)\rho Q_r c_p (T_{r,exh} - T_{r,in}) = (1-CI)P \quad (10)$$

The total external cooling power supplied by the room is the sum of Equation 10 over all n racks:

$$P_{total\ external\ cooling} = \sum_{i=1}^{n}(1-CI_i)P_i \quad (11)$$

Thus, for either cold or hot aisle analyses, the layout which has the least net heating/cooling affect on the data center environment as a whole may be found by minimizing $$\sum_{i=1}^{n}(1-CI_i)P_i$$

which will, for simplicity, be referred to herein for at least some embodiments as the total escaped power for both cold and hot-aisle applications.

Of course, it is always possible to over-provision cooling such that the total escaped power is equal to zero and such layouts may not be optimal from an energy efficiency perspective; in the ideal case, the total cooler airflow would match the total rack airflow while the total escaped power would be zero. Furthermore, since CI is based solely on airflow, minimizing the total escaped power does not necessarily imply that rack inlet temperatures will be minimized or, indeed, even within the desired operating range. This would be the case, for example, if cooling resources were substantially under provisioned. The total escaped power metric allows an entire cluster to be compared to another in terms of its net heating/cooling affect on the room environment and is particularly useful for optimizing the layout of a cluster. For example, several alternative layouts may be acceptable on an inlet temperature basis (in fact, all inlet temperatures could be at some ideal level, e.g., 72° F.); however, it is still possible to identify the best layout based on the total escaped power.

An example of using the total escaped power metric in combination with capture index to optimize a cluster layout in accordance with one embodiment will now be described. FIGS. 6a and 6b show two alternative arrangements of a fixed population of racks and coolers comprising a hot-aisle cluster. FIG. 6a shows the initial layout while FIG. 6b shows an optimized layout which, as discussed below, can be identified with the aid of CI and total escaped power. Though the surrounding environment is not shown in the figures, the local-cooler cluster is the only equipment located in a single room which is 22 ft wide, 18 ft deep, and 12 ft high. (Note that a complete data center could be considered in the same manner without loss of generality.) The coolers supply 68° F. air at the rate of 2720 cfm; rack power is indicated in the figure and airflow rates are based on a 20° F. temperature rise across the racks. The ratio of total cooling to rack airflow is approximately 1.4 for the cluster. The rack inlet temperatures are desired to be in the range of 68° F.-77° F. as desired in accordance with ASHRAE (2004) for Class 1 equipment. Because the coolers supply airflow at 68° F., we need only consider performance relative to the upper-temperature limit. Airflows and temperatures were determined from CFD simulations and computed rack-level (SHI, maximum rack inlet temperature, and CI) and cluster-level (net escaped power, SHI, and $RCI_{HI}$) metrics are shown in the figures.

FIG. 6a shows the initial layout representing an arbitrary but realistic arrangement of racks and coolers. Cooling performance is close to compliance with ASHRAE (2004), as indicated by an $RCI_{HI}$ of 98%, with just two racks slightly above the 77° F. maximum recommended temperature. The computed inlet temperatures show which racks are "out of compliance" but they do not reveal what caused these two racks to receive excessively warm air. To understand the cause of the excessive temperatures, consider the CI values. The CI values for the two out-of-spec racks are fairly high, thus, the excessive inlet temperatures are likely not a result of their own exhaust. More likely, the problematic warm air originated from the racks in the opposite (lower) row which have relatively low CI values—in the range of 82-84%. A measure of the overall heating of the surrounding room environment is provided by the total escaped power which is 6.6 kW for the initial layout. The example cluster is in a sealed environment; therefore, there is a balance between the total rack and cooler power for the steady-state conditions considered. By contrast, the total escaped power quantifies the heating effect of the warm air that is not directly captured by the coolers; for this example, warm air which is not directly captured by the coolers is recirculated through the racks. If an entire data center were considered, the un-captured warm air could affect neighboring racks or any other part of the data center.

Since CI explicitly shows the degree to which each rack's exhaust is captured it is more closely aligned to the design strategy than inlet temperature or SHI for the purposes of optimizing the layout. For example, it can be seen from the computed CI's—although not obvious from temperatures—in the initial layout that there is sufficient, perhaps excessive cooling, on the left side of the cluster and insufficient cooling on the right side of the cluster. If an entire data center were considered, the link between inlet temperatures and incomplete rack-exhaust capturing would be even more complex and indirect. With this information, an optimized layout may be found by trial-and-error or some formal optimization technique. FIG. 6b shows an optimized layout. All metrics indicate much improved performance with a maximum inlet temperature of 69° F. While the rack-level SHI's track more closely to inlet temperature than CI's, the cluster-level SHI tracks well with the total escaped power; the latter two quantities each improved by an order of magnitude from the initial to the optimized layout. $RCI_{HI}$ improved by only two percentage points, from 98% to 100%, reflecting the fact that the compliance with the ASHRAE (2004) specification was reasonably good to start with.

In embodiments described above, a data center management application utilizes the capture index metric to analyze and optimize the cooling performance of a cluster of racks in a data center. While CFD software can be used to determine the capture indexes, the performance of a CFD analysis can be complicated and computationally intensive, and depending on the simulation being run, and the computer hardware being used, it may require several minutes to possibly hours to run a simulation. The time required to run CFD simulations becomes particularly problematic during optimization routines, when it is desirable to quickly determine CI's for numerous possible layouts of racks in a cluster. To reduce computation time in embodiments of the invention, other near real-time analysis techniques are used to determine CI for racks in a cluster. These techniques include an algebraic technique, a neural network technique, and a partially decoupled aisle (PDA) CFD technique.

In the algebraic technique, a separate calculation scheme is used for a hot aisle configuration, and a cool aisle configuration. The algebraic technique for a hot aisle configuration is based on the assumption that rack-cooler interactions depend primarily on the magnitude of airflow associated with the racks and coolers and their relative geometric positions. A rack at each location (or narrower slice along the row) can be thought of has having a certain potential to supply airflow to other locations. This potential varies inversely with the distance of separation. Furthermore, the amount of airflow a rack can supply to other locations increases as its own total airflow increases. It is found that the net airflow, which can be supplied to a particular location $A_i$ (which may represent a 6 inch slice or "slot" along the A row), can be adequately represented as follows:

$$(Q_{Ai})_{sup\ net} = (Q_{Ai})_{sup\ self} + \sum_{all\ j \neq i} (Q_{Aj})_{sup\ self} E e^{-F\Delta x} + \quad (12)$$
$$D \left\{ (Q_{Bi})_{sup\ self} + \sum_{all\ j \neq i} (Q_{Bj})_{sup\ self} E e^{-F\Delta x} \right\}$$

where, $(Q_{Ai})_{sup\ net}$=The net maximum airflow that can be supplied to location $A_i$ including contributions from all racks $(Q_{Ai})_{sup\ self}$=The airflow supplied by the rack at location $A_i$ $(Q_{Bi})_{sup\ self}$=The airflow supplied by the rack at location $B_i$ $\Delta x$=horizontal distance between locations (slots) i and j E, F are empirical constants D=empirical "coupling" constant accounting for effects from the opposite row Constants D, E and F may be determined by comparing the results of the algebraic model to actual or known values which, in theory, can be determined from experimental measurement; however, CFD modeling provides a more practical means of generating data for a large number of potential layouts. The constants may take on different values depending on application details such as the type of racks, rack exhaust and surrounding ambient temperatures, etc.

The net maximum airflow that can be supplied to various locations in the B row is computed in an analogous manner.

Finally, Equation (13) having the same physical form as Equation (12), is applied to coolers rather than racks to compute the net maximum airflow, which can be captured at any location.

$$(Q_{Ai})_{cap\ net} = (Q_{Ai})_{cap\ self} + \sum_{all\ j \neq i}(Q_{Aj})_{cap\ self}Ae^{-B\Delta x} + \qquad (13)$$

$$C\left\{(Q_{Bi})_{cap\ self} + \sum_{all\ j \neq i}(Q_{Bi})_{cap\ self}Ae^{-B\Delta x}\right\}$$

where $(Q_{Ai})_{cap\ net}$=The net maximum airflow that can be captured at location $A_i$ including contributions from all coolers $(Q_{Aj})_{cap\ self}$=The airflow captured by the cooler at location $A_j$ $(Q_{Bj})_{cap\ self}$=The airflow captured by the cooler at location $B_j$ $\Delta x$=horizontal distance between locations (slots) i and j A, B are empirical constants C=empirical "coupling" constant accounting for effects from the opposite row Constants A, B and C may be determined from experimental measurement or CFD as discussed above. The constants may take on different values depending on application details such as the type of coolers, rack exhaust and surrounding ambient temperatures, etc.

Constants A, B, E, and F are found to be typically independent of the hot aisle width while C and D may depend on aisle width.

The CI is then estimated as the ratio of net airflow captured and net airflow supplied at any location expressed as a percentage with values capped at 100%.

Calculations per Equation 12 and 13 are typically performed for every 6-inch slot along both rows so that the code will be applicable to all standard-width equipment; results are averaged over the actual entire rack width before being presented.

The algebraic technique for a cold aisle configuration is computed in a manner similar to that used for a hot aisle. However, in a cold aisle analysis racks "capture" airflow while coolers "supply" airflow. Furthermore, cooling airflow may be supplied by any combination of perforated floor tiles and coolers. Each equipment location is considered to have a certain potential to capture airflow from other locations. This potential varies inversely with the distance of separation. Furthermore, the amount of airflow a rack can capture increases as its own airflow increases. It is found that the net airflow, which can be captured at a particular location $A_i$ (which may represent any slot along the A row), can be adequately represented as follows:

$$(Q_{Ai})_{cap\ net} = (Q_{Ai})_{cap\ self} + \sum_{all\ j \neq i}(Q_{Aj})_{cap\ self}Ae^{-B\Delta x} + \qquad (14)$$

$$C\left\{(Q_{Bi})_{cap\ self} + \sum_{all\ j \neq i}(Q_{Bi})_{cap\ self}Ae^{-B\Delta x}\right\}$$

where $(Q_{Ai})_{cap\ net}$=The net maximum airflow that can be captured at location $A_i$ including contributions from all other racks $(Q_{Ai})_{cap\ self}$=The airflow captured by the rack at location $A_i$ $(Q_{Bi})_{cap\ self}$=The airflow captured by the rack at location $B_i$ $\Delta x$=horizontal distance between locations (slots) i and j A, B are empirical constants C is an empirical "coupling" constant accounting for effects from the opposite row Constants A and B are fixed for a range of typical design parameters while C typically varies with aisle width.

The net maximum airflow that can be captured by various locations in row B is computed in an analogous manner.

When calculating the potential of perforated tiles to supply airflow to any equipment location, each 6" strip of perforated tile (tile slot) can be thought of as having a certain potential to supply airflow to all equipment locations. The model discussed below assumes that there are three perforated tiles across the width of the cold aisle. The rows of perforated tiles are referred to by the index k which can take on values of 1, 2, or 3; the k=1 and k=3 rows of tiles are adjacent to equipment rows A and B respectively while k=2 refers to the middle row of perforated tiles. The model can be generalized to handle any number of rows of perforated tiles.

The potential of tiles to supply airflow to any equipment position varies inversely with the distance of separation and the amount of airflow tile can supply increases as its own total airflow increases. It is found that the net airflow, which can be supplied to a particular rack location $A_i$ by all tile slots, can be adequately represented as follows:

$$(Q_{Ai})_{sup\ net} = (Q_{Ai})_{sup\ self} + \qquad (15)$$

$$\sum_{all\ k}\left\{\sum_{all\ other\ tile\ slot\ locations}(Q_{kj})_{sup\ self}Ee^{-F\cdot Distance(i,j,k)}\right\}$$

where $(Q_{Ai})_{sup\ net}$=The net maximum airflow that can be supplied to location $A_i$ including contributions from all tiles $(Q_{Ai})_{sup\ self}$=The airflow supplied by the tile slot immediately adjacent to equipment location $A_i$. (This is the tile slot at location i, row k=1 for equipment position $A_i$)

$(Q_{kj})_{sup\ self}$=The airflow supplied by the tile slot at row k, location j The "all other tile slot locations" in the summation above includes all tile slot locations except the tile slot immediately adjacent to the equipment location—which is captured by the $(Q_{Ai})_{sup\ self}$ term.

Figure 7:
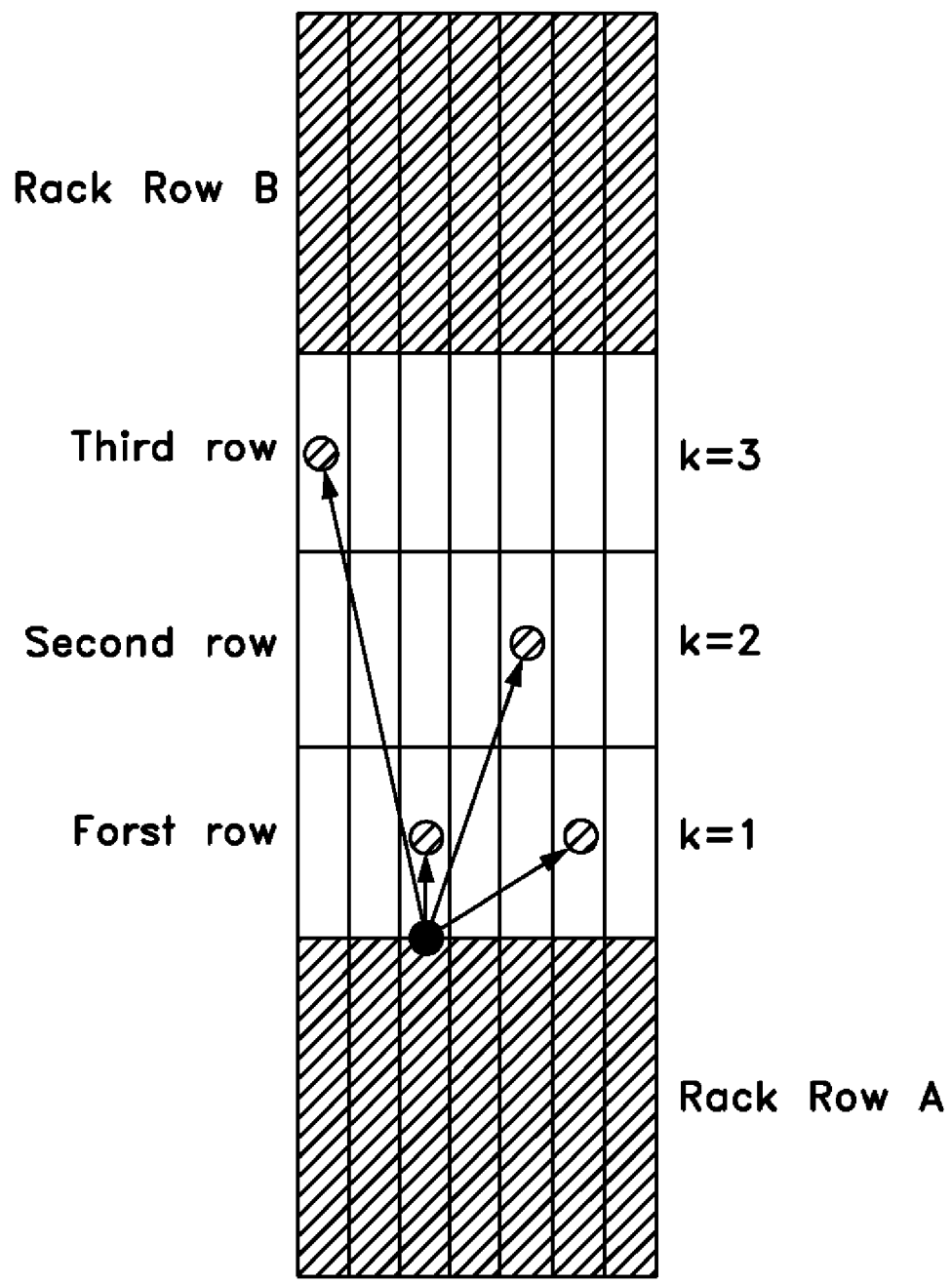
FIG. 7 shows a diagram used in determining capture index in accordance with an algebraic method of one embodiment.

E and F are fixed for a range of typical design parameters, Distance (i,j,k) is the distance between rack $A_i$ and tile slot (k,j) (at row k, location j). Calculation of Distance (i, j, k) is shown below with units of feet used in all equations. Distances between equipment locations and tile slots are taken with respect to the middle of the equipment slot bounding the cold aisle and the center of the tile slot as illustrated in FIG. 7.

The distance between equipment location $A_j$ and the tile slot in row k=1 and location j along the row $$Distance = \sqrt{\frac{(i-j)^2}{4} + 1}$$

The distance between equipment location $A_j$ and the tile slot in row k=2 and location j along the row $$Distance = \sqrt{\frac{(i-j)^2}{4} + 9}$$

The distance between equipment location $A_j$ and the tile slot in row k=3 and location j along the row $$Distance = \sqrt{\frac{(i-j)^2}{4} + 25}$$

The net maximum airflow that can be supplied to various locations in row B is computed in an analogous manner.

For cold aisle clusters which include at least one cooler, each cooler can be thought of as having a potential to supply airflow to all equipment locations. The rack directly opposite the cooler receives the most direct airflow from the cooler. The amount of airflow supplied to each equipment location varies according to the path of the cooler airflow, which forms circulations within a certain effective range. It is found that the net airflow, which can be supplied to a particular rack location $A_i$ by all coolers, can be adequately represented as follows:

$$(Q_{Ai})_{cooler\ net} = (Q_{Ai})_{cooler\ self} + \sum_{all\ j \neq i} (Q_{Aj})_{cooler\ self} Ge^{-H(2 \cdot EffDis - \Delta x)} + \quad (16)$$
$$D\left((Q_{Bi})_{cooler\ self} + \sum_{all\ j \neq i} (Q_{Bj})_{cooler\ self} Ge^{-H\Delta x}\right)$$

where $(Q_{Ai})_{cooler\ net}$=The net maximum airflow that can be supplied to location $A_i$ by all coolers $(Q_{Ai})_{cooler\ self}$=The airflow supplied by the cooler at location $A_i$ $(Q_{Bi})_{cooler\ self}$=The airflow supplied by the cooler at location $B_i$ G and H are empirical constants fixed for a range of typical design parameters D is an empirical "coupling" constant accounting for effects from the opposite row EffDis is an empirical constant which represents the effective distance along the row over which the cooler airflow patterns may affect equipment locations. It may depend on type of cooler, aisle width and other design parameters.

$\Delta x$ is defined as the distance along the equipment rows between location i and j:

$$\Delta x = \begin{cases} |i-j| & \text{(when } |i-j| \leq EffDis\text{)} \\ EffDis & \text{(when } |i-j| > EffDis\text{)} \end{cases}$$

The CI is then estimated as the ratio of net airflow supplied and net airflow captured at any location expressed as a percentage with values capped at 100%.

Calculations per equations (14)-(16) are typically performed for every 6-inch slot along both rows so that the code will be applicable to all standard-width equipment; results are averaged over the actual entire rack width before being presented.

In at least one embodiment, a partially decoupled aisle (PDA) CFD analysis is used to determine the capture index. In the partially decoupled aisle method, a single cold or hot aisle is analyzed at a time as if it were "decoupled" from the surrounding data center environment. The effect of the surrounding environment is "partially" accounted for in the boundary conditions selected for the isolated-aisle analysis. The airflow patterns inside the isolated aisle are determined directly from CFD. With the airflow patterns known, performance metrics such as the rack-by-rack Capture Indices (CI) and temperatures may be readily computed.

In at least one embodiment, the PDA method is applied to clusters of equipment formed by two substantially equal-length rows of racks and, optionally, local coolers located across a cold or hot aisle from one another. Such groupings of equipment are naturally a preferred arrangement because of the inherent separation of cool rack inlet and warm rack exhaust airflow. All the racks in a data center which are members of such clusters may be analyzed by repeated application of the PDA-based tool. The PDA method may also serve as the engine for a layout-optimization tool or be used to quickly create "training data" which may be used to develop even faster design and analysis tools.

The PDA method is described in U.S. patent application Ser. No. 11/342,300, referenced above. As described in the referenced application, the PDA method may be used for analyzing clusters of racks around a cold-aisle in a raised-floor environment. The airflow in the cold aisle can be modeled sufficiently as "ideal," one of the benefits of which is that the complete cold-aisle airflow pattern may be determined by simply adding up the airflow patterns that would be present if each rack were the only rack drawing airflow. The "elemental" rack airflows in turn may be determined (offline) from CFD analysis and stored in empirical models. Cooling metrics may then be computed based on the final resulting airflow pattern. In the referenced application, PDA is used in conjunction with a superposition method to determine airflows. PDA-superposition may be used with embodiments of inventions discussed herein, however, when local coolers are present, this method may be restricted to the analysis of traditional raised-floor cold aisles and can be difficult to extend to non-uniform perforated-tile layouts. The PDA-CFD method used in embodiments of the invention described herein has improved functionality over the PDA superposition method.

In one embodiment, the PDA-CFD method is applicable for use with a single cluster of equipment consisting of two equal length rows of equipment such as shown in FIGS. 1a and 1b. In practice, if there is a small mismatch in row length or relative offset, fictitious "zero-airflow equipment" can be added to achieve the equal-length requirement. The aisle (or computational domain) to be analyzed is then of simple rectangular shape when "cut out" of the larger environment; surfaces for which boundary conditions must be determined are of minimum size and simply defined.

The Boundary Conditions (BC's) along the floor and equipment faces are assumed known. The floor may have portions of prescribed inflow at a known temperature representing perforated-tile airflow and is otherwise a solid surface. Along the equipment faces, the flow rate is known—outflow for racks in a cold aisle analysis or coolers in a hot-aisle analysis or inflow at a known temperature for racks in a hot aisle analysis or coolers in a cold aisle analysis. The perforated tile airflow rate is either known from measurement or estimated.

Figure 8A:
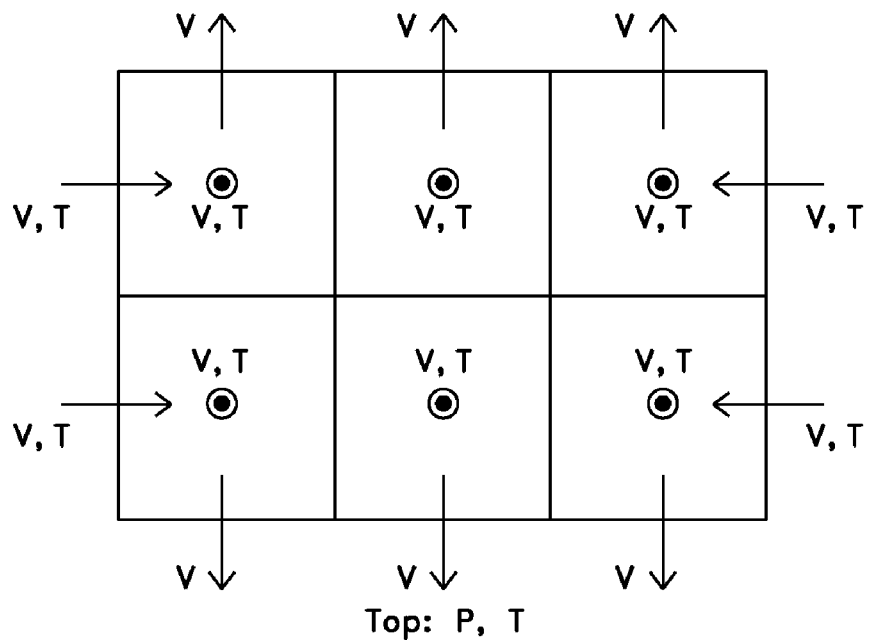
FIGS. 8a and 8b demonstrate PDA boundary conditions used in accordance with at least one embodiment.
Figure 8B:
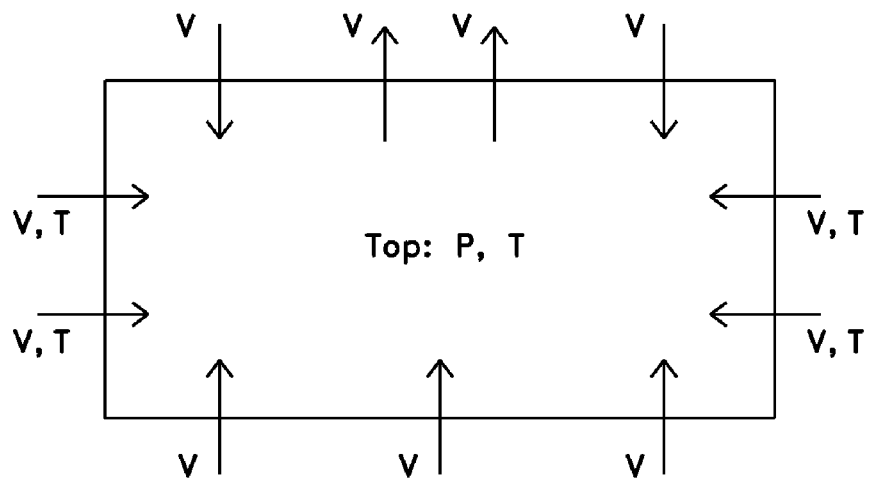

If the correct, detailed top and end boundary conditions were known, the isolated-aisle analysis results would also be rigorously correct. In embodiments of the invention, the choice of boundary conditions for the top and ends which are sufficiently accurate and yet practical allow the PDA-CFD method to be used for estimating capture index. One approach for determining boundary conditions is to leave the top and ends "open" (a uniform pressure boundary condition) so that airflow can enter or exit as dictated by the physics of the airflow within the aisle. This approach does not take the effects of the surrounding room environment into consideration and does not produce acceptable results for typical applications. However, it is desirable to leave some portion of the boundaries "open;" and in another approach in accordance with one embodiment, the top is specified as an "open" boundary rather than the ends. The top boundary can be quite large and may have many regions of both inflow and outflow; it may be impractical to determine, and store as an empirical model, the proper prescribed-velocity boundary conditions for the top. With the top left "open," velocities along the ends are specified to build in some effect of the room environment. Although the end airflow can in general be quite complex, it is only necessary to prescribe fairly uniform airflow over large portions of the boundary to achieve adequate approximations. In one approach, each end of the aisle is broken into two equal-width vertical strips over which a uniform inflow or outflow is assigned. In at least one embodiment, temperatures along the top of the aisle and along the ends wherever the end airflow is in the inward direction are inputs to the analysis. Typically, these temperatures can be adequately estimated between the extremes of temperature in the problem at hand, and errors only have a secondary effect on the airflow patterns in that buoyancy forces are somewhat affected. FIGS. 8a and 8b show the PDA boundary conditions for the examples of FIGS. 1a and 1b.

There are many ways to model the end airflows and an infinite combination of room environments that may be considered. The PDA method in accordance with at least some embodiments provides a rough approximation for the top and end airflows; recall the top of the aisle is left "open" and the ends are each divided into only two specified flow boundary conditions. In longer clusters, the airflow towards the middle of the aisle will be unaffected by the end airflows.

The end airflow is affected by cluster details and the room environment. The former includes the geometry of the cluster as well as the details of all racks, coolers, and perforated tiles which may be present. The latter includes the geometry of the surrounding room, details of neighboring equipment; in short, everything in the room responsible for or impacting the airflow and temperatures immediately surrounding the cluster. Racks, coolers and perforated tiles nearest to the ends of the row generally have the greatest impact on end airflow.

The difference in temperature between the perforated tile airflow and the environment immediately around the cluster (i.e. buoyancy) is the most significant "room effect" in many practical cases. To account for the effect of rack position and airflow, many thousand full-room CFD simulations were performed with varying equipment layouts. Ultimately, it was determined that the (each of the four) cold-aisle end airflows can be represented, in dimensionless form, by the following polynomial regression model:

$$Q_{end}^* = a_0 + a_{A1}Q_{A1}^* + a_{A2}Q_{A2}^* + \ldots a_{An}Q_{An}^* + a_{B1}Q_{B1}^* + a_{B2}Q_{B2}^* + \ldots a_{Bn}Q_{Bn}^* + a_1 AR + a_2 AR^2 + a_3 AR^3 + a_4 AR^4 + \Delta T^* \quad (17)$$

where the $Q_{Ai}^*$'s and $Q_{Bi}^*$'s are the dimensionless airflow rates of the racks at position i from the end in the A and B rows respectively, the a's are polynomial regression coefficients, AR is the ratio of total cooling airflow to total rack airflow, $\Delta T^*$ is the dimensionless temperature difference, and n is the number of racks per row. Dimensionless airflows are formed by dividing the corresponding dimensional quantity by the per-tile airflow rate. The dimensionless temperature difference is defined as the temperature difference between the supply airflow and the surrounding room ambient divided by the typical temperature-difference scale of 20° F. (11° C.). Since the racks nearest the end of the row have the greatest effect on the end airflow, the $a_{Ai}$ and $a_{Bi}$ coefficients decrease in magnitude from left to right in Equation (17). Since the only room-environment parameter in Equation (17) is $\Delta T^*$, other room effects (e.g. ceiling height, proximity of walls and other equipment, etc.) are taken into account by creating a unique set of regression coefficients for each such variation of interest. As stated above however, $\Delta T$ is the dominant room-environment parameter and, as long as this parameter is estimated reasonably well, good end airflow estimates can be made in embodiments of the invention for a variety of room environments.

The end airflows for a local-cooler hot-aisle application may be computed in the same general manner. However, in these applications, momentum forces associated with the rack and cooler airflow dominate and buoyancy has little effect on the end airflow. Additionally, a general model needs to be able to handle any arbitrary arrangement of racks and coolers. Furthermore, local coolers may be either 1 ft (300 mm) or 2 ft (600 mm) wide while racks may be 2 ft (600 mm) or 2.5 ft (750 mm) wide. The hot-aisle end airflows can be represented, in dimensional form this time, by the following multiple linear regression model:

$$Q_{end} = a_0 + a_{A1}Q_{A1} + a_{A2}Q_{A2} + \ldots a_{An}Q_{An} + a_{B1}Q_{B1} + a_{B2}Q_{B2} + \ldots a_{Bn}Q_{Bn} \quad (18)$$

where the $Q_{Ai}$'s and $Q_{Bi}$'s are the dimensional airflow rates of the racks or coolers at position from the end in the A and B rows respectively, the a's are linear regression coefficients, and n is the number of "slots" per row. Dimensional airflows are typically easier to work with in this case because there is no convenient airflow scale with which a non-dimensionalization may be performed. Rack airflows are directed into the hot aisle and have a positive sign. Cooler airflows are directed out of the hot aisle and have a negative sign. Each index i represents a 0.5 ft (150 mm) slice of the cluster or "slot" rather than an entire object where 0.5 ft (150 mm) is the greatest common denominator among object widths that are to be handled in the model. (Of course, the raised-floor cold-aisle model could be formulated in the same manner so as to also account for general rack widths.) As before, the racks and coolers nearest the end of the row have the greatest effect on the end airflow and the $a_{Ai}$ and $a_{Bi}$ coefficients generally decrease in magnitude from left to right in Equation (18).

Equation (18) does not contain any room-environment parameters, so a new unique set of regression coefficients are determined for each room environment of interest. In practice, the local-cooler hot-aisle end airflow tends to be dominated by the rack and, in particular, cooler airflow (which is comparatively high) so that an end airflow model determined for some reasonable room environment (e.g., a symmetric layout of clusters in a data center) provides a reasonable estimate for a range of actual room environments and is used in at least some embodiments of the invention.

In general, simple regression models produce somewhat better predictions of end airflow for raised-floor applications rather than for local-cooler applications as evidenced by larger coefficients of determination ($R^2$). This is due to the fact that the same regression coefficients are used for both racks and coolers in the latter application. Furthermore, the airflow patterns are simply more complex when local coolers are present.

Finally, end airflow models can be developed in embodiments of the invention following a similar approach for other applications including local-cooler and mixed local-cooler-and-perforated-tile cold-aisle applications. The PDA method is used in at least some embodiments to develop real-time and near-real time cooling performance calculators for data centers. Such tools facilitate a scientific analysis and layout-optimization without requiring a full CFD simulation of the data center, which can be time consuming. The PDA-CFD calculator of at least some embodiments will now be described in further detail with reference to specific examples.

Figure 9A:
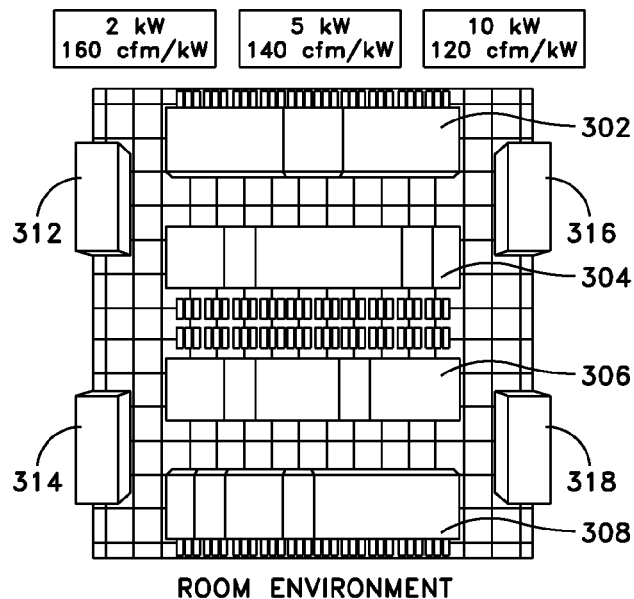
FIG. 9a shows a layout of a data center that may be analyzed in accordance with at least one embodiment.

FIG. 9a shows a portion of a raised-floor data center containing four rows of racks 302, 304, 306 and 308 and four CRAC units 312, 314, 316 and 318. This is a standard design which uses alternating cold and hot aisles which repeat on a 7-tile pitch with the CRAC units located at the ends of the hot aisle. The ceiling is located 12 ft (3.7 m) above the raised floor. The power and airflow rates of the racks are shown in the FIG. 9b; CRAC airflow is 4200 cfm (2000 l/s) each so that the total ratio of CRAC to rack airflow is 0.9. Airflow through the perforated tiles is assumed a uniform 420 cfm (200 l/s) per perforated tile.

Figure 9B:
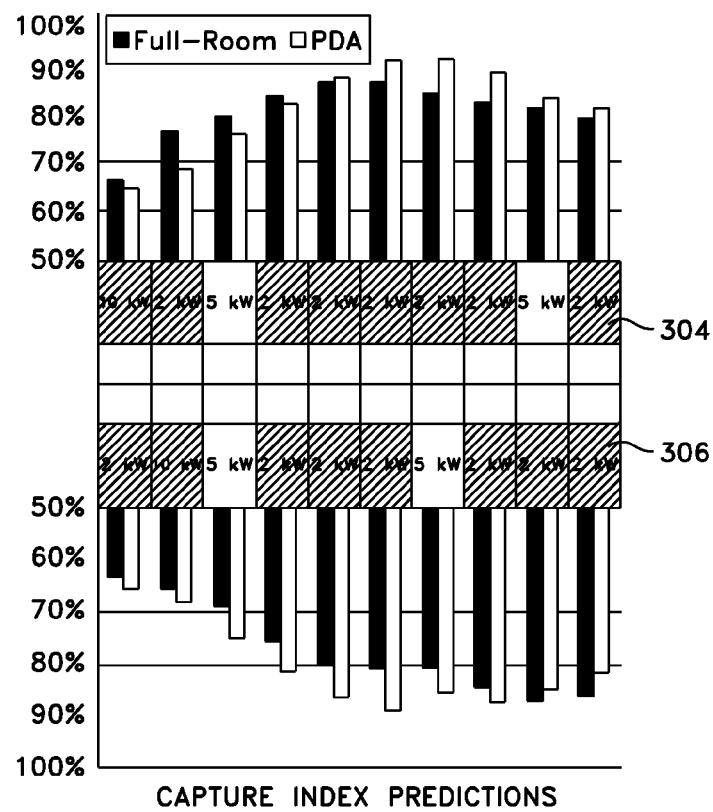

The capture indices for the middle cluster of racks, including rows 304 and 306, bounding the central cold-aisle were computed based on a full-room CFD of the environment shown in FIG. 9a and also using a PDA-CFD-based tool in accordance with embodiments of the present invention. The latter employs an end-airflow model which was created based on a fairly large, open environment. Even though the present example, with CRAC's drawing airflow near the ends of the cold aisle, features a much different room environment, results compare favorably as shown in FIG. 9b. Capture index trends are captured well and all predictions agree within about 7%.

FIG. 10a shows a complete hard-floor data center which utilizes local coolers and includes rows 320, 322, 324, 326, 328 and 330. The ceiling height is 12 ft (3.7 m). The middle hot-aisle cluster of equipment (rows 324 and 326) consists of 12 racks and four local coolers. The ratio of total cooler to rack airflow is 1.3. FIG. 10b shows the comparison of capture indices computed by full CFD and PDA-CFD-based tools for the middle hot aisle cluster. The latter employs an end-airflow model which was created based on an environment in which symmetry boundaries are assumed to exist around the perimeter of the cluster. Again, even though the actual room environment is much different, overall capture index predictions compare favorably as shown in FIG. 9b. Capture index trends are captured well and all predictions agree within about 10%.

Comparisons between full CFD and PDA-CFD results were shown above for two specific, practical examples. In these examples, a portion of the error in the PDA-CFD results may be due to the end airflow model (i.e., the wrong average airflow values may have been assigned) and another portion may be due to the error intrinsic to the basic PDA assumptions of an "open" top and fairly uniform end airflow boundary conditions. In embodiments of the invention, PDA-based tools, including PDA-CFD, provide reasonable estimates of cooling performance which generally trend in the right direction as various design alternatives are considered.

In analyzing data centers in embodiments of the invention using the PDA-CFD calculator, generally, hot-aisle clusters are the preferred analysis unit if the data center design includes local coolers or return vents. In this case, the "room-neutral" strategy may be adopted. For other applications, including raised-floor (without local return vents) and mixed raised-floor and local-cooler environments, cold-aisle clusters may be analyzed. Also, the PDA-CFD approach may be utilized indirectly, as the cooling engine of a broader optimization tool or to quickly create large quantities of data for training an empirical calculator.

In at least some embodiments, when a CFD or PDA-CFD analysis is conducted, a computational grid using uniform 6"×6"×6" cells are used. The use of cells of this size, refines the aisle without creating an excessive number of cells, which provides a satisfactory balance between speed and accuracy. Further, the use of cells of this size, aligns well with equipment boundaries and aisle widths. Typical racks and coolers have widths of 1 ft., 2 ft., or 2.5 ft, while aisles are commonly in the 3 ft. to 6 ft range by 6" increments.

In at least some embodiments, as will now be described, artificial neural networks, commonly referred to as just neural networks (NN), can be used to analyze airflows and generate the capture index for each rack or a cluster of racks. In general, neural networks are well known. Typically a NN consists of an input layer, hidden layers, and an output layer. Each layer consists of a number of neurons. The hidden and output-layer neurons are each linked to the neurons in the previous layer. The other key elements of the NN include the weights associated with each link, an optional bias term, and activation and transfer functions. NN "knowledge" is stored as the connection weights. Nonlinearities and complexities of the model are captured by the activation and transfer functions, and by the number of neurons in the hidden layers, respectively.

The Multilayer Perceptron (MLP) using a back-propagation training algorithm is the most common of all neural network models and is used in at least some embodiments of the present invention. The binary sigmoid activation function is also well suited for embodiments of the present invention. Like capture index, this function has a range of zero to one and it is has the following form:

$$f(x) = \frac{1}{(1+e^{-x})} \qquad (19)$$

The output of any layer becomes the input to the next layer. The following equation relates the output of a layer and the interconnection weights between the two layers:

$$A_j = f\left(\sum_{j=1}^{n} W_{ij} A_i + b_j\right) \quad (20)$$

Here $A_i$ is the input unit in the first layer that broadcasts the signal to all units in the second layer. $A_j$ is the output of the $j^{th}$ neuron in the second layer, $W_{ij}$ represents the connecting weights between the two layers, $b_j$ is the bias on the unit j, and n is the number of units in the first layer. The activation function, f, provides a non-linear gain to the artificial neuron. The weights are determined by iteration to produce a minimum value of the applicable metric, for example, the mean square error (MSE):

$$MSE = \frac{1}{N} \sum_{i}^{N} (CI_{desired} - CI_{predicted})^2 \quad (21)$$

where N is the total number of training cases, and $CI_{desired}$ and $CI_{predicted}$ are the known values predicted, for example, by CFD or PDA-CFD and the Neural Network model, respectively.

Initial weights are set to small random values; the back propagation algorithm updates the weights after each training pattern is presented and the best weights are saved during the training process.

One advantage of the use of NN in embodiments of the present invention lies in its ability to establish non-linear relationships between cluster-layout details (input vector) and resulting rack capture indices (output vector). The former includes the physical arrangement of racks and coolers, rack power and airflow, and cooler airflow. In at least some embodiments, thousands of hypothetical but realistic cluster layouts are designed, and then the hot-aisle CI values are computed using Computational Fluid Dynamics (CFD) for each layout. Finally, the NN model is trained to "learn" the relationship between the input and output vectors. While the training data may be produced by a traditional CFD analysis, considerable time savings can be achieved by using the PDA-CFD techniques discussed above. Given sufficient training data, the Neural Networks can be applied to virtually any data center cooling application. However, as an example, the prediction of CI values for a 14 ft (4.27 m) long cluster of racks and coolers bounding a hot-aisle as shown in FIG. 11 will now be described. A similar methodology can be adapted to design NN models for other cluster lengths.

For the example, the PDA-CFD calculator described above is used to create training data considered here. In each simulation, the top boundary condition is "open" for airflow to enter or exit the aisle (0 gauge pressure, 68° F.). Fixed airflow and temperature (in the case of "inflow") boundary conditions are prescribed at the ends of the aisle. The Flovent CFD engine discussed above is used to compute the airflow pattern and CI values in the partially decoupled hot aisle. A grid size of 6 inch is used based on a grid sensitivity analysis and the k-ε turbulence model is employed.

To develop an effective mapping between input and output data, the NN model is trained using realistic scenarios. A software tool was created using Excel and VBA to design the representative cluster layouts for the NN training. Each designed cluster layout contains all the information about the racks and coolers and their relative positions in the cluster. In this example, the neural network model is designed to accept 2 ft (610 mm) or 2.5 ft (762.5 mm) wide racks and 1 ft (305 mm) wide local coolers as input. Since 0.5 ft (152.5 mm) is the greatest common denominator among object widths, the NN model is based upon 0.5 ft (152.5 mm) slices of the cluster or "slots". For example, a 2 ft (610 mm) wide rack of 2 kW of power and 320 cfm (0.15 m³/sec) of airflow is actually modeled as 4 separate objects each of 0.5 ft (152.5 mm) in width with 0.5 kW of power and 80 cfm (0.038 m³/sec) of airflow. Capture indices are then computed for each of the rack's 4 slots and then averaged before presented to the user of the cooling calculator tool. This approach substantially increases the number of variables that must be modeled but greatly simplifies layout generation, creation of the training cases by PDA-CFD, and the NN model creation.

In the example, training cases include 1 ft (305 mm) wide coolers which extract 2900 cfm of warm air from the hot aisle. The rack airflow is linked to specified rack power at the rate of 160 cfm/kW (0.076 m³/sec per kW); this is equivalent to assuming a 20° F. (11° C.) temperature rise across the rack. Two thousand representative cluster layouts (scenarios) were created, all 14 ft (4.27 m) long with equal row length. A complete description of each scenario includes the slot-by-slot power value for both rows of equipment. For racks, slot power is represented as a positive number. For coolers, slot power is based on "effective power" defined as the cooler airflow rate divided by 160 cfm/kW (0.076 m³/sec per kW) and specified with a negative sign. For example, if the first two objects in one row are a 4 kW 2 ft (610 mm) wide rack and a 2900 cfm (1.38 m³/sec) 1 ft (305 mm) wide cooler respectively, the input data for the first 6 slots would be as follows: 1 kW, 1 kW, 1 kW, 1 kW, −9.0625 kW, and −9.0625 kW.

For each training scenario, rack powers are selected from a pool of possible power values in the range of 0 to 10 kW and the number of coolers are selected such that the overall cluster air ratio (ratio of total cooler to total rack airflow) is in the (realistic) range of 1 to 4. While a 14 ft (4.27 m) long cluster is considered here, there are, in general, 4*L number of slots, where L is the cluster length. Slot positions are labeled as $RA_1, RA_2, \ldots RA_{28}$, and $RB_1, RB_2, \ldots RB_{28}$ in FIG. 11a and FIG. 11b.

A CI is computed for every rack slot of every scenario based on PDA-CFD and a software tool was created using Excel and VBA to automate this process. The effective slot power along with the corresponding CI values at all slots comprises the training data set for the Neural Network. Rack power, effective cooler power, and the overall cluster air ratio are inputs to the NN model while CI values at each slot are presented to the NN model as desired output.

In at least one example, each cluster is geometrically symmetric about both axial and longitudinal mid-planes, and three additional training layouts can be obtained for each (asymmetric) layout analyzed by PDA-CFD. These new layouts have the same inventory of equipment, and thus the same air ratio, as the original, calculated layout; however, the ordering of equipment is different. Thus, only one quarter of the training layouts need actually be computed by PDA-CFD. Using this technique, 2,000 layouts computed by PDA-CFD generate a total of 8,000 training layouts.

The Excel and VBA-based tool, discussed below, is used to train the Neural Network. One quarter of the cluster layouts are selected randomly from the training set and set aside to monitor over-training and predictability of the NN model. The NN is trained for a single slot at a time and the training parameters are adjusted to speed up the learning process.

During the Neural Network training process, the effective power at each slot ($RA_1, RA_2, \ldots RA_{28}$, and $RB_1, RB_2, \ldots RB_{28}$) and AR are repeatedly presented to the network to predict the CI value at each slot. The error between the predicted and desired CI value is calculated and then fed back to the network (back-propagation of the associated error). The weights are then adjusted to make the network-predicted CI values match those from PDA-CFD. The weights which create the best match are saved and then may be used to predict the CI values for any new set of cluster input data.

Again, because of the geometric symmetry of the cluster, only the slots covering about half the length of a row are trained: the first L slots if 2*L is even, and first L+1 slots if 2*L is odd. The CI values at the remaining slots may be determined directly by an appropriate reinterpretation of the results for the half-cluster results. In addition to being efficient, this use of symmetry forces the NN output to be perfectly symmetric.

As discussed above, an Excel and VBA-based software tool may be used to compute the CI values for a specified cluster layout. A process for this computation will now be described further. The user of the tool interacts with the input and observes the output of the network through a simple graphical user interface which displays a plan view of the cluster similar to that shown in FIGS. 11a and 11b.

In a first stage of the process, the user graphically enters the cluster layout information. Rack and cooler locations are defined as well as the power of each rack and the airflow of each cooler. (Additional information may be entered to further describe the surrounding room environment if applicable NN models are available.) The air ratio is computed based on the specified layout.

In a second stage, rack and cooler information are translated into effective power at each slot—positive values for racks, negative values for coolers. And these input values further get scaled. The scaled input values are then multiplied by the connecting weights between the input and hidden layers. Resulting values are summed and processed using the (sigmoid) activation function. The resulting values are multiplied by the weights between the hidden and output layer, and are summed and processed by the (sigmoid) activation function and scaled back to give the neural network CI values. The CI values at the slots are then finally averaged over the actual object widths to produce the final CI values.

The example above addresses a well-defined cluster of racks and only CI values are predicted. However, the NN model can also be trained to handle other applications and to predict other data center related cooling performance metrics such as Recirculation Index (RI), Supply Heat Index (SHI) and Return Heat Index (RHI), Rack Cooling Index (RCI), or, directly, the equipment inlet temperatures.

Since the NN calculator computations are very fast, it is used in some embodiments as a "cooling prediction engine" upon which optimization functionality may be built.

In embodiments of the invention, in addition to using the metrics capture index and total escaped power to characterize the cooling performance in a cluster of racks, the return temperature of air to coolers in a hot aisle may be used to characterize and optimize the performance of a cluster. When the PDA-CFD calculator is used to determine capture index, the return temperatures are calculated as part of the analysis and are available as outputs. When return temperatures are not directly calculated, they may be estimated based on CI values in accordance with one embodiment of the invention that will now be described.

In the return temperature calculator, the average return temperature over all coolers is first estimated based on known CI values which govern amount of rack airflow captured by the coolers:

$$T_{ave}^C = \beta T_{ave}^R + (1-\beta) T_{amb} \quad (22)$$

where, $T_{ave}^C$ = global average cooler return temperature $T_{amb}$ = ambient temperature $$\beta = \frac{\sum_{i=1}^{n} CI_i Q_i^R}{\sum_{i=1}^{N} Q_i^C}$$

= the fraction of cooler airflow which comes directly from the racks. ($0 \le \beta \le 1$)

$$T_{ave}^R = \frac{\sum_{i=1}^{n} Q_i^R T_i^R}{\sum_{i=1}^{n} Q_i^R} = \text{the average rack exhaust temperature}$$

n = the number of racks
N = the number of coolers

In some embodiments, the global average cooler return temperature may be used as an estimate of the return temperature for each cooler in the cluster. However, any individual cooler may have a return temperature below or above this average value based primarily on CI's and rack exhaust temperatures in the immediate vicinity of the cooler of interest. In at least some embodiments, the individual cooler return temperatures are estimated based on the following model. The overall strategy in this approach is to first account for cooler-by-cooler return temperature variations without regard to correct absolute temperature and then scale all values such that the return temperatures are consistent with the global average as discussed above.

The return temperature for any cooler can be estimated as:

$$T_j^C = \frac{\sum_{i=1}^{n} f_{ij} Q_i^R T_i^R}{\sum_{i=1}^{n} f_{ij} Q_i^R} \quad (23)$$

where $f_{ij}$ is the fraction of airflow from rack i which is captured by cooler j. Since only CI's are estimated by the calculators (and not $f_{ij}$'s), the main task in estimating the cooler-by-cooler return temperature variation is to estimate the $f_{ij}$'s empirically. We know the following about $f_{ij}$:

$f_{ij}$ should increase as $Q_j^C$ cooler airflow increases $f_{ij}$ should decrease as $Q_i^R$ increases $0 \le f_{ij} \le CI_i$ $f_{ij}$ decreases with increasing distance $\Delta x$ between the rack and cooler The following empirical estimate for $f_{ij}$ used by the calculator satisfies the above conditions:

$$f_{ij} = Cl_i e^{\frac{-a\Delta x Q_i^R}{Q_j^C}} \text{ where } \sum_{j=1}^{N} e^{\frac{-a\Delta x Q_i^R}{Q_j^C}} = 1,$$

$\alpha$ is a constant determined empirically, typically by the comparison of model predictions to corresponding CFD predictions, and is fixed for a range of typical design parameters. $\Delta x$ is calculated as the distance from the center of the rack exhaust to the center of the cooler extract for all rack-cooler pairs—either in the same or opposite rows.

Once the $f_{ij}$'s are computed, cooler return temperatures may be computed from equation (23). Finally, all cooler return temperatures are scaled based on the global average return temperature:

$$(T_j^C)_{new} = \frac{T_j^C T_{ave}^C}{(T_{ave}^C)_{unscaled}} \tag{24}$$

where $T_{ave}^C$ is the global average return temperature as discussed in the preceding section and $(T_{ave}^C)_{unscaled}$ is the average cooler return temperature as computed based on the unscaled $T_j^C$ values.

The return temperature can be used in embodiments of the invention to determine the capacity of coolers used in the clusters, which depends strongly on this quantity. The ability to estimate cooler capacity accurately, in turn, allows an accurate prediction of the number of coolers required to satisfy design goals which may include providing cooling redundancy. The return temperature then, as well as the CI predictions, may affect layout design as determined manually or through optimization algorithms.

In embodiments of the invention, in addition to determining cooling characteristics of a cluster of racks, it is also desirable and possible to optimize the cooling performance. Optimization examples include:
1) Determining the best layout of IT equipment racks given physical space constraints and cooling and power redundancy goals. This may include a determination of the number of coolers as well as UPS's, PDU's and other power-distribution equipment required to meet specified goals and then determining the best layout of all of this equipment with respect to one or more design goals such as minimizing the total escaped power.
2) Minimizing the amount of cooling airflow required for a specified cluster of equipment by decreasing the airflow of one or more coolers until all racks just reach the design CI threshold.
3) Redistributing the rack heat loads in a specified cluster of equipment to, for example, minimize total escaped power while satisfying a minimum CI requirement for all racks. This example is applicable to server virtualization where it is possible to move computer workload and therefore heat.
4) Identifying the best location to place an additional heat load (e.g. install a server) with respect to total escaped power or other design goals.

In at least some embodiments, the NN calculator computations are very fast and the NN calculator is used as a cooling prediction engine upon which optimization functionality is built. However, in other embodiments, the other calculators described herein may also be used in an optimization process. In one embodiment, the NN tool is combined with a commercial optimization tool. In one embodiment, the optimization tool uses a genetic algorithm and may be implemented using, for example, the Risk Optimizer available from Palisade Corporation of Ithaca, N.Y. to create an integrated tool that automatically suggests the best cluster layout among several possible cluster layouts.

Figure 11A:
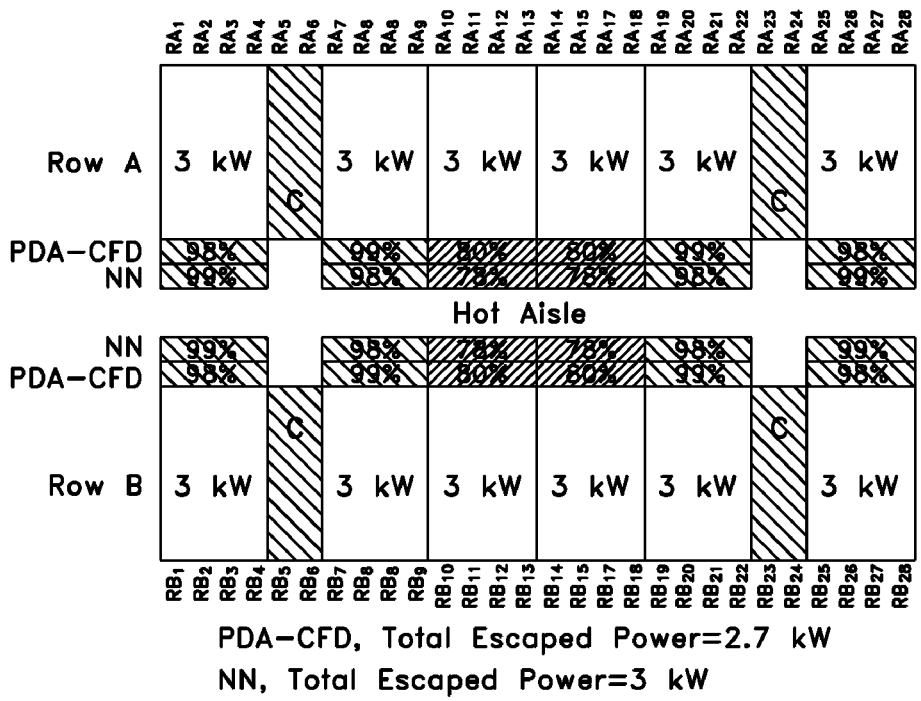
FIG. 11a and 11b show comparisons of CI computation methods of the present invention for two different rack clusters.
Figure 11B:
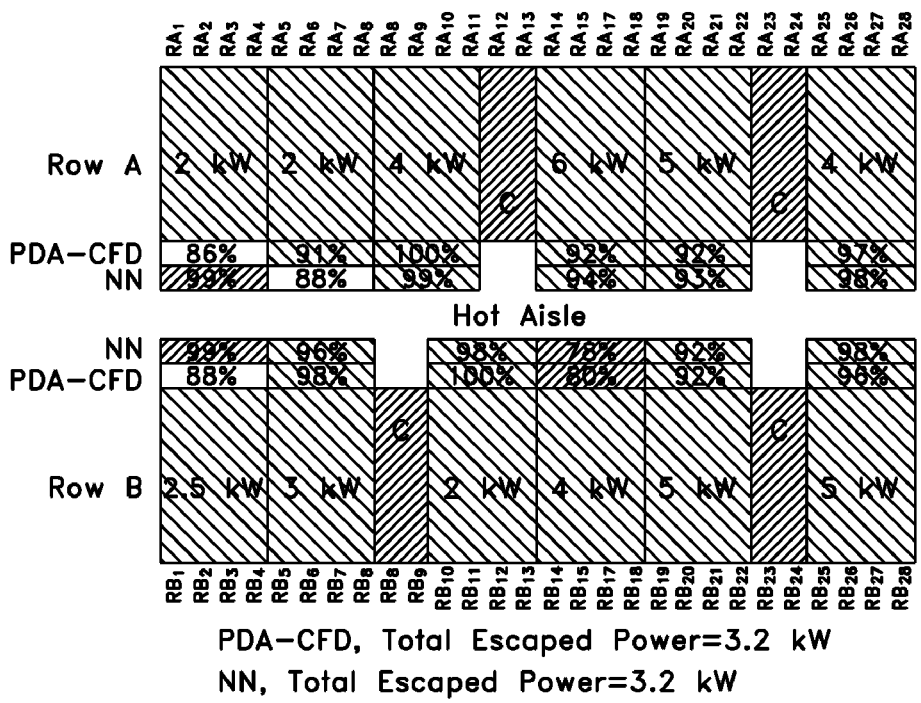
Figure 12A:
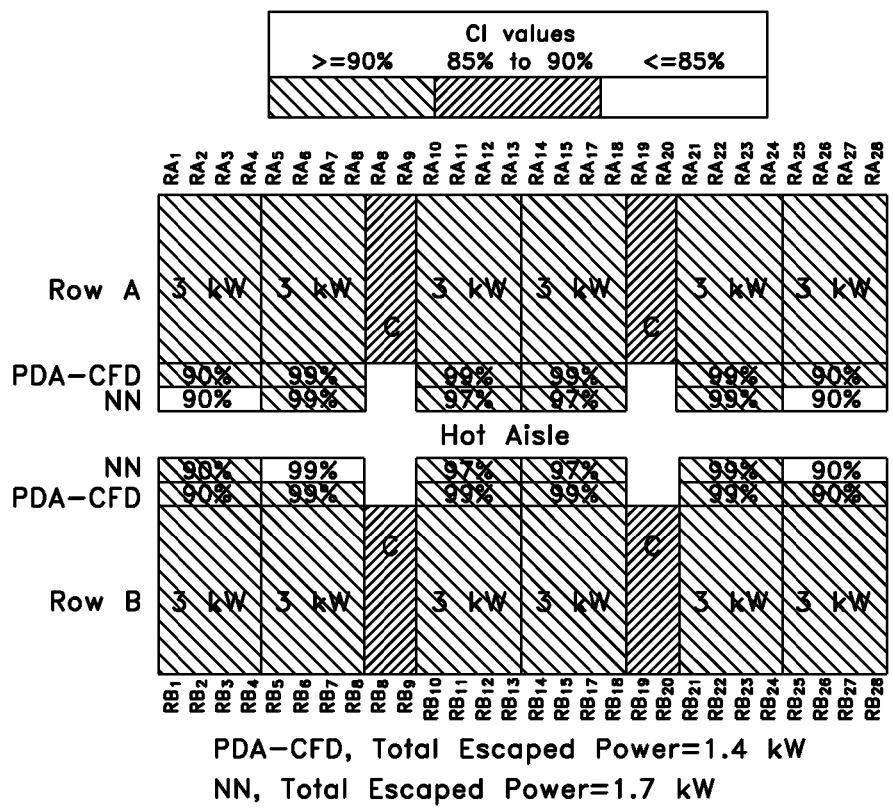
FIGS. 12a and 12b show optimized layouts of the rack clusters of FIGS. 11a and 11b.
Figure 12B:
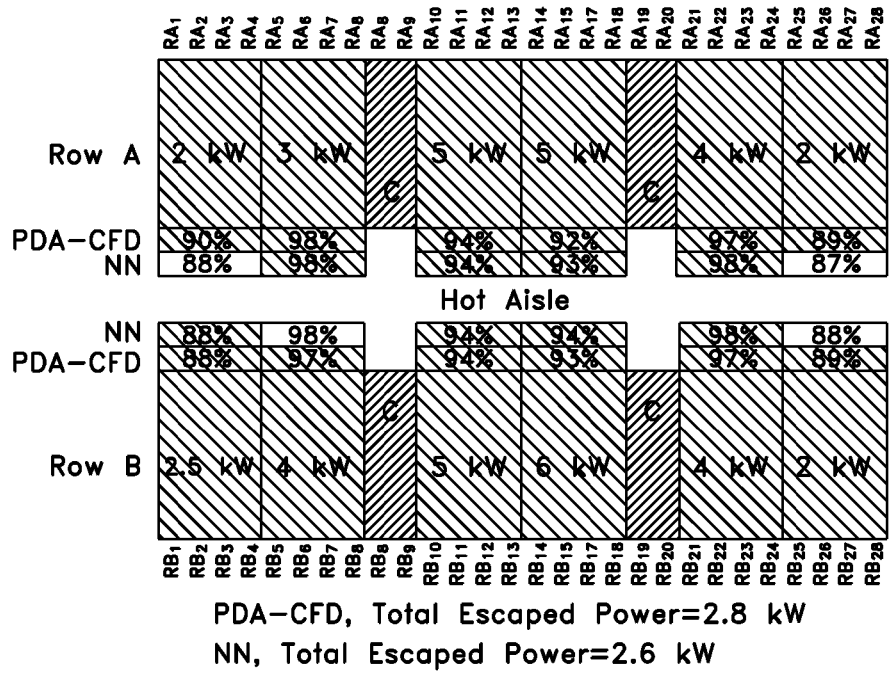

For example, consider the problem of rearranging the equipment in the clusters of FIGS. 11a and 11b into optimum layouts—layouts in which the total escaped power is minimized subject to the constraint that all racks CI's are greater than 85%. FIGS. 12a and 12b show the resulting optimized arrangements along with values computed from PDA-CFD for comparison. Determining the optimum layout for the symmetrical layout of FIG. 11a is comparatively simple. However, cluster layouts such as in FIG. 11b, with a larger number of unique possible arrangements, pose a greater challenge. For these problems, the optimization tool together with the NN model is a particularly valuable tool. This combined tool can also help meet other complex data center design challenges such as determining the maximum additional heat load (equipment) that can be installed in the cluster subject to certain cooling requirements or the amount of additional cooling required to achieve a specified cooling objective. Optimization tools used in embodiments can also be used to optimize power distribution equipment in a data center layout in combination with cooling equipment to optimize a layout from a power and cooling perspective and to provide desired redundancy levels.

In the neural network calculator discussed above, neural network models are developed for rack clusters of various layouts and lengths. In at least one embodiment, the neural network analysis involves 0.5 foot slices of the clusters or slots. In one embodiment, the neural network calculator is configured such that long clusters (e.g. greater than 30 feet) can be analyzed without developing specific models for these clusters. Within a long aisle, the influence of racks or coolers decreases with increasing distance, and at some distance, the influence of the racks and coolers becomes less significant and need not be considered in the neural network analysis. Empirical analysis has found that after a distance of 15 feet, in typical clusters, the slots do not affect each other. In this embodiment, neural network calculations for clusters up to 30 feet in length are performed as described above. For clusters greater than 30 feet, the CI value at a slot position is calculated based on the effect of slots in a 30 foot span. As an example, for a 34 foot long cluster, the analysis may start from the left corner and first row of the cluster. CI values are determined for slots covering the first 15 feet of length and are calculated as if for a 30 foot long cluster, while assuming no effect from the slots corresponding to the 4 foot length on the far right side of the cluster. The CI values for middle slots (after the first 15 feet) are calculated by considering the first 15 feet distance on both the left and right side of the relevant slot. In a similar manner, symmetry is used to calculate the CI values starting from other ends of the cluster.

Various embodiments according to the invention may be implemented on one or more computer systems as discussed above. For example, a data manager application containing calculation and analysis tools described herein may be implemented in a single computer system or in multiple computer systems. These computer systems may be, for example, general-purpose computers such as those based on Intel PENTIUM-type processor, Motorola PowerPC, Sun UltraSPARC, Hewlett-Packard PA-RISC processors, or any other type of processor.

Figure 13:
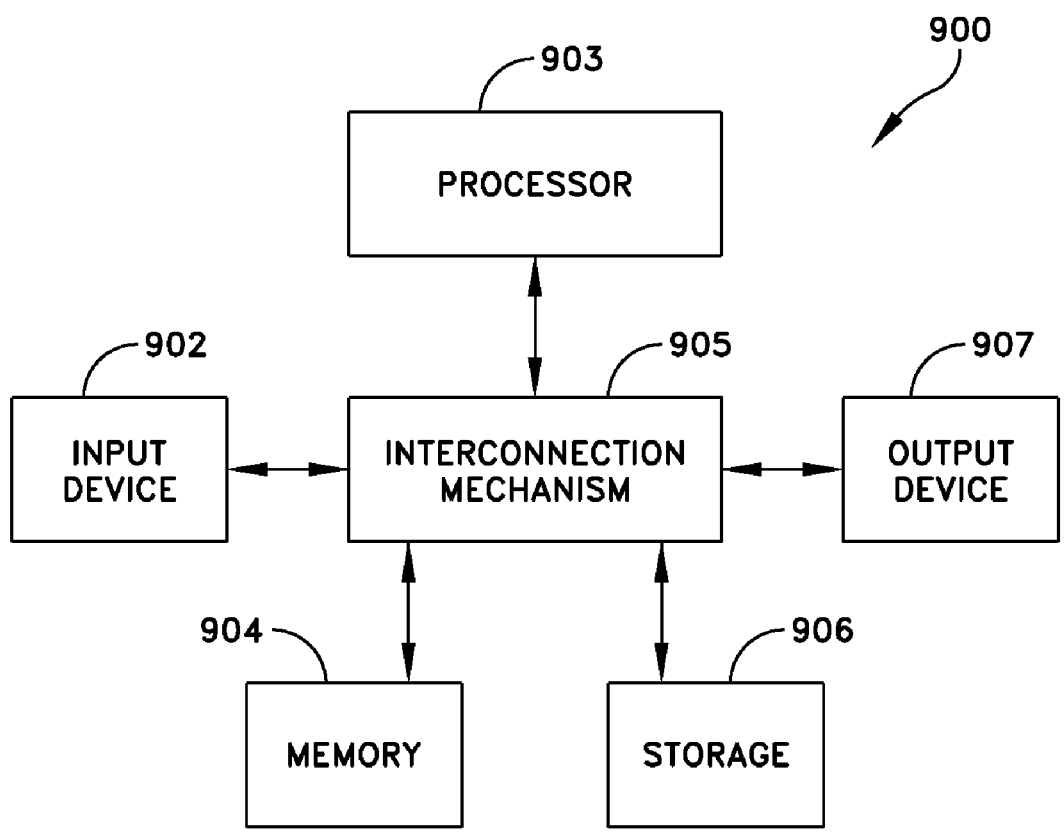
FIG. 13 is a functional block diagram of a computer system that may be used in embodiments of the invention.

For example, various aspects of the invention may be implemented as specialized software executing in a general-purpose computer system 900 such as that shown in FIG. 13. The computer system 900 may include a processor 903 connected to one or more memory devices 904, such as a disk drive, memory, or other device for storing data. Memory 904 is typically used for storing programs and data during operation of the computer system 900. The computer system 900 may also include a storage system 906 that provides additional storage capacity. Components of computer system 900 may be coupled by an interconnection mechanism 905, which may include one or more busses (e.g., between components that are integrated within a same machine) and/or a network (e.g., between components that reside on separate discrete machines). The interconnection mechanism 905 enables communications (e.g., data, instructions) to be exchanged between system components of system 900.

Computer system 900 also includes one or more input devices 902, for example, a keyboard, mouse, trackball, microphone, touch screen, and one or more output devices 907, for example, a printing device, display screen, speaker. In addition, computer system 900 may contain one or more interfaces (not shown) that connect computer system 900 to a communication network (in addition or as an alternative to the interconnection mechanism 905).

Figure 14:
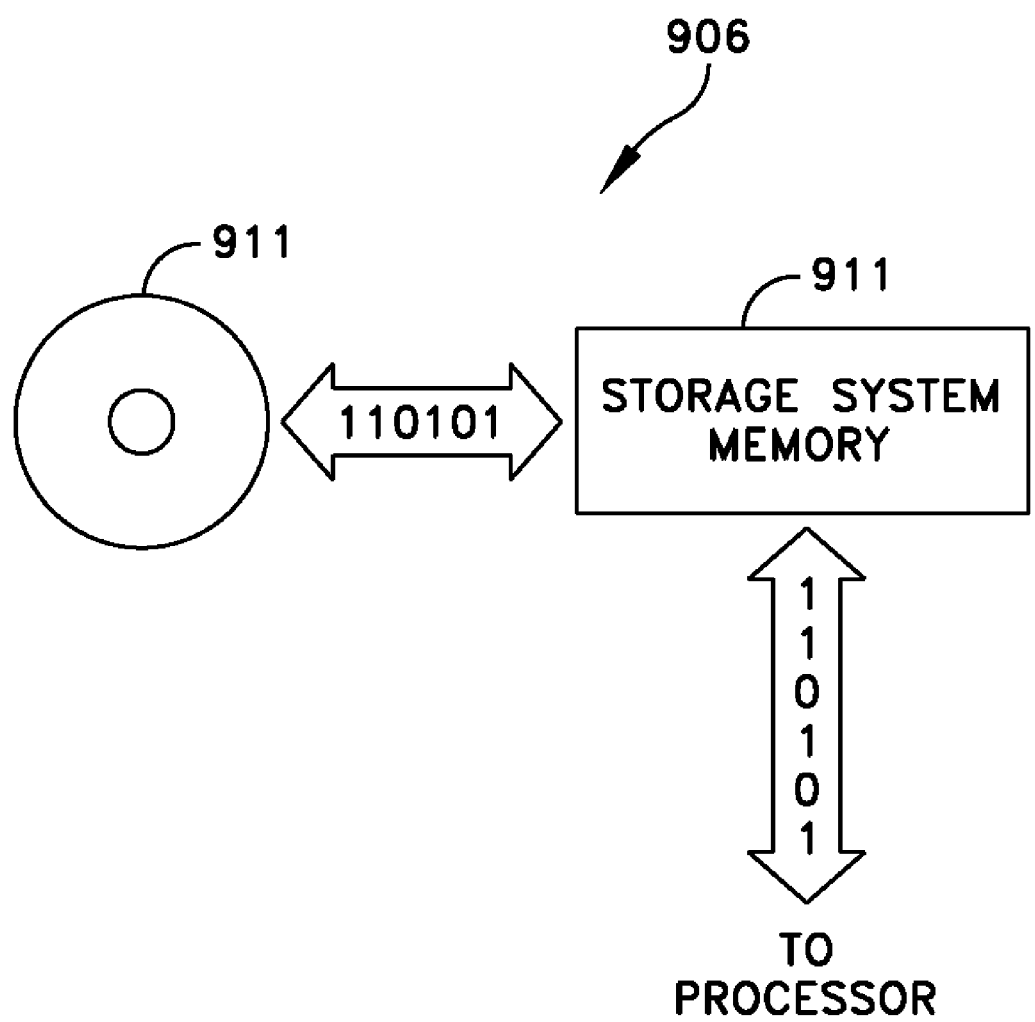
FIG. 14 is a functional block diagram of a storage system that may be used with the computer system of FIG. 13.

The storage system 906, shown in greater detail in FIG. 14, typically includes a computer readable and writeable nonvolatile recording medium 911 in which signals are stored that define a program to be executed by the processor or information stored on or in the medium 911 to be processed by the program to perform one or more functions associated with embodiments described herein. The medium may, for example, be a disk or flash memory. Typically, in operation, the processor causes data to be read from the nonvolatile recording medium 911 into another memory 912 that allows for faster access to the information by the processor than does the medium 911. This memory 912 is typically a volatile, random access memory such as a dynamic random access memory (DRAM) or static memory (SRAM). It may be located in storage system 906, as shown, or in memory system 904. The processor 903 generally manipulates the data within the integrated circuit memory 904, 912 and then copies the data to the medium 911 after processing is completed. A variety of mechanisms are known for managing data movement between the medium 911 and the integrated circuit memory element 904, 912, and the invention is not limited thereto. The invention is not limited to a particular memory system 904 or storage system 906.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component.

Although computer system 900 is shown by way of example as one type of computer system upon which various aspects of the invention may be practiced, it should be appreciated that aspects of the invention are not limited to being implemented on the computer system as shown in FIG. 13. Various aspects of the invention may be practiced on one or more computers having a different architecture or components shown in FIG. 13. Further, where functions or processes of embodiments of the invention are described herein (or in the claims) as being performed on a processor or controller, such description is intended to include systems that use more than one processor or controller to perform the functions.

Computer system 900 may be a general-purpose computer system that is programmable using a high-level computer programming language. Computer system 900 may also be implemented using specially programmed, special purpose hardware. In computer system 900, processor 903 is typically a commercially available processor such as the well-known Pentium class processor available from the Intel Corporation. Many other processors are available. Such a processor usually executes an operating system which may be, for example, the Windows 95, Windows 98, Windows NT, Windows 2000 (Windows ME) or Windows XP operating systems available from the Microsoft Corporation, MAC OS System X operating system available from Apple Computer, the Solaris operating system available from Sun Microsystems, or UNIX operating systems available from various sources. Many other operating systems may be used.

The processor and operating system together define a computer platform for which application programs in high-level programming languages are written. It should be understood that embodiments of the invention are not limited to a particular computer system platform, processor, operating system, or network. Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems coupled to a communications network. For example, a computer system that performs build-out or design functions of a data center may be located remotely from a system manager that monitors and manages components of a data center. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server or multi-tier system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP). For example, one or more database servers may be used to store device data that is used in designing layouts, and one or more servers may be used to efficiently perform cooling calculations associated with embodiments of the present invention.

It should be appreciated that the invention is not limited to executing on any particular system or group of systems. Also, it should be appreciated that the invention is not limited to any particular distributed architecture, network, or communication protocol.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

Embodiments of a systems and methods described above are generally described for use in relatively large data centers having numerous equipment racks, however, embodiments of the invention may also be used with smaller data centers and with facilities other than data centers. Further, as discussed above, embodiments of the present invention may be used with facilities having raised floors as well as with facilities that do not have a raised floor. In embodiments of the present invention discussed above, results of analyses may be described as being provided in real-time or near real-time. As understood by those skilled in the art, the use of the term real-time is not meant to suggest that the results are available immediately, but rather, are available quickly giving a designer the ability to try a number of different designs over a short period of time, such as a matter of minutes.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of determining cooling characteristics of a data center comprising:
   receiving data related to a configuration of equipment in the data center;
   identifying rack clusters in the configuration of equipment, and for each rack cluster determining whether the rack cluster is a hot aisle cluster or a cold aisle cluster; and
   determining a capture index for at least one equipment rack of at least one rack cluster based on identification of the at least one rack cluster as a hot aisle cluster or a cold aisle cluster.

2. The method of claim 1, wherein receiving data further includes receiving information related to airflow and power associated with the equipment.

3. The method of claim 2, wherein the information related to airflow includes airflow of cooling air available to the at least one rack cluster.

4. The method of claim 3, wherein the information related to airflow includes the temperature of the cooling air.

5. The method of claim 2, wherein the information related to airflow includes airflow of rack hot air exhaust drawn by coolers.

6. The method of claim 5, wherein the information related to airflow includes the temperature of the rack hot air exhaust.

7. The method of claim 1, wherein the rack clusters include at least one hot aisle cluster.

8. The method of claim 1, wherein the rack clusters include at least one cold aisle cluster.

9. The method of claim 1, further comprising selecting a selected calculation model for determining the capture index based at least in part on the configuration of the equipment and calculating the capture index using the selected calculation model.

10. The method of claim 9, wherein the selected calculation model is an algebraic model.

11. The method of claim 10, wherein the algebraic model calculates the capture index of a rack in a hot aisle cluster based on a ratio of total captured airflow to total supplied airflow at the rack, wherein the total captured airflow is calculated based on airflow of all coolers in the hot aisle cluster and horizontal distances from the coolers to the rack, and wherein the total supplied airflow is calculated based on airflow of the rack, airflow off neighboring racks and horizontal distances of the neighboring racks from the rack.

12. The method of claim 11 wherein the total supplied airflow and total captured airflow are further calculated using a coupling coefficient to weight calculated airflow of racks in a row opposite the rack.

13. The method of claim 10, wherein the algebraic model calculates the capture index of a rack in a cold aisle cluster having a raised floor based on a ratio of total supplied airflow to total captured airflow at the rack, wherein the total captured airflow is calculated based on airflow of the rack, airflow of neighboring racks and horizontal distances of the neighboring racks from the rack, and wherein the total supplied airflow is calculated based on supplied airflow at the rack associated with airflow of tiles of the raised floor and geometric distances of the tiles from the rack.

14. The method of claim 13 wherein the total captured airflow is further calculated using a coupling coefficient to weight the calculated airflow of racks in a row opposite the rack.

15. The method of claim 10, wherein the algebraic model calculates the capture index of a rack in a cold aisle cluster having both a raised floor and at least one cooler based on a ratio of total supplied airflow to total captured airflow at the rack, wherein the total captured airflow is calculated based on airflow of the rack, airflow of neighboring racks and horizontal distances of the neighboring racks from the rack, and wherein the total supplied airflow is calculated based on (1) supplied airflow at the rack associated with airflow of tiles of the raised floor and geometric distances of the tiles from the rack, and (2) airflow of coolers in cold aisle cluster, airflow path of the coolers, and horizontal distances of the coolers from the rack.

16. The method of claim 9, wherein the selected calculation model is a computational fluid dynamics model.

17. The method of claim 9, wherein the selected calculation model is a neural network model.

18. The method of claim 9, wherein the selected calculation model is a PDA-CFD model.

19. The method of claim 1, wherein the data center includes at least one in-row cooling unit disposed in a row of equipment racks, and wherein the method further includes determining temperature of return air to the at least one in-row cooling unit based on the capture index for each rack within a cluster associated with the in-row cooling unit.

20. The method of claim 1, further comprising determining total escaped power for at least one rack cluster, and providing an indication of the total escaped power.

21. The method of claim 1, further comprising comparing the capture index with a threshold and providing an indication if the capture index is below the threshold.

22. The method of claim 21, further comprising optimizing a layout of at least one cluster based on an indication of a rack of the at least one cluster having a capture index less than the threshold and providing an optimized layout.

23. A computer readable medium having stored thereon sequences of instructions including instructions that will cause a processor to:
   receive data related to a configuration of equipment in the data center;
   identify rack clusters in the configuration of equipment, and for each rack cluster determine whether the rack cluster is a hot aisle cluster or a cold aisle cluster; and determine a capture index for at least one equipment rack of at least one rack cluster based on identification of the at least one rack cluster as a hot aisle cluster or a cold aisle cluster.

24. The computer readable medium of claim 23, wherein the sequences of instructions, further include instructions that will cause the processor to receive information related to airflow and power associated with the equipment.

25. The computer readable medium of claim 23, wherein the sequences of instructions, further include instructions that will cause the processor to determine capture index based on airflow of cooling air available to the at least one rack cluster.

26. The computer readable medium of claim 25, wherein the sequences of instructions, further include instructions that will cause the processor to determine capture index based on temperature of the cooling air.

27. The computer readable medium of claim 23, wherein the sequences of instructions, further include instructions that will cause the processor to determine capture index based on airflow of rack hot air exhaust drawn by coolers.

28. The computer readable medium of claim 27, wherein the sequences of instructions, further include instructions that will cause the processor to determine capture index based on temperature of the rack hot air exhaust.

29. The computer readable medium of claim 23, wherein the sequences of instructions, further include instructions that will cause the processor to determine capture index for at least one rack of a hot aisle cluster having an in-row cooler.

30. The computer readable medium of claim 23, wherein the sequences of instructions, further include instructions that will cause the processor to determine capture index for at least one rack of one cold aisle cluster that receives cooling air from a perforated tile of a raised floor.

31. The computer readable medium of claim 23, wherein the data center includes at least one in-row cooling unit disposed in a row of equipment racks, and wherein the sequences of instructions, further include instructions that will cause the processor to determine temperature of return air to the at least one in-row cooling unit based on the capture index for each rack within a cluster associated with the in-row cooling unit.

32. The computer readable medium of claim 23, wherein the sequences of instructions, further include instructions that will cause the processor to determine total escaped power for at least one rack cluster, and provide an indication of the total escaped power.

33. The computer readable medium of claim 23, wherein the sequences of instructions, further include instructions that will cause the processor to compare the capture index with a threshold and provide an indication if the capture index is below the threshold.

34. The computer readable medium of claim 33, wherein the sequences of instructions, further include instructions that will cause the processor to optimize a layout of at least one cluster based on an indication of a rack of the at least one cluster having a capture index less than the threshold and provide an optimized layout.

35. A data center management system comprising:
a memory for storing data; and
a controller coupled to the memory and configured to:
receive data related to a configuration of equipment in the data center;
identify rack clusters in the configuration of equipment, and for each rack cluster
determine whether the rack cluster is a hot aisle cluster or a cold aisle cluster; and
determine a capture index for at least one equipment rack of at least one rack cluster based on identification of the at least one rack cluster as a hot aisle cluster or a cold aisle cluster.

36. The data center management system of claim 35, wherein the controller is further configured to receive information related to airflow and power associated with the equipment.

37. The data center management system of claim 35, wherein the controller is further configured to determine capture index based on airflow of cooling air available to the at least one rack cluster.

38. The data center management system of claim 37, wherein the controller is further configured to determine capture index based on temperature of the cooling air.

39. The data center management system of claim 35, wherein the controller is further configured to determine capture index based on airflow of rack hot air exhaust drawn by coolers.

40. The data center management system of claim 39, wherein the controller is further configured to determine capture index based on temperature of the rack hot air exhaust.

41. The data center management system of claim 35, wherein the controller is further configured to determine capture index for at least one rack of a hot aisle cluster having an in-row cooler.

42. The data center management system of claim 35, wherein the controller is further configured to determine capture index for at least one rack of one cold aisle cluster that receives cooling air from a perforated tile of a raised floor.

43. The data center management system of claim 35, wherein the controller is further configured to determine temperature of return air to at least one in-row cooling unit based on the capture index for each rack within a cluster associated with the in-row cooling unit.

44. The data center management system of claim 35, wherein the controller is further configured to determine total escaped power for at least one rack cluster, and provide an indication of the total escaped power.

45. The data center management system of claim 35, wherein the controller is further configured to compare the capture index with a threshold and provide an indication if the capture index is below the threshold.

46. The data center management system of claim 45, wherein the controller is further configured to optimize a layout of at least one cluster based on an indication of a rack of the at least one cluster having a capture index less than the threshold and provide an optimized layout.

47. The data center management system of claim 35, further comprising a graphical output device coupled to the controller, and wherein the controller is configured to provide a graphical output of a layout of at least one cluster of racks to the graphical output device.

* * * * *

UNITED STATES PATENT AND TRADEMARK OFFICE
CERTIFICATE OF CORRECTION

| | | |
|---|---|---|
| PATENT NO. | : 7,991,592 B2 | Page 1 of 1 |
| APPLICATION NO. | : 12/019109 | |
| DATED | : August 2, 2011 | |
| INVENTOR(S) | : James W. VanGilder et al. | |

It is certified that error appears in the above-identified patent and that said Letters Patent is hereby corrected as shown below:

At column 5, line number 16, the second occurrence of FIG. "6b" should read FIG. --6a--.

Signed and Sealed this

Twenty-seventh Day of September, 2011

David J. Kappos
*Director of the United States Patent and Trademark Office*